United States Patent
Eun et al.

(10) Patent No.: US 9,001,587 B2
(45) Date of Patent: Apr. 7, 2015

(54) FLASH MEMORY AND READING METHOD OF FLASH MEMORY

(75) Inventors: Hee-seok Eun, Hwaseong-si (KR); Sang-hoon Lee, Yongin-si (KR); Jae-hong Kim, Hwaseong-si (KR); Sun-mi Yoo, Seoul (KR); Seok-min Yoon, Suwon-si (KR); Jong-youl Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 13/618,336

(22) Filed: Sep. 14, 2012

(65) Prior Publication Data
US 2013/0070526 A1 Mar. 21, 2013

(30) Foreign Application Priority Data
Sep. 16, 2011 (KR) .................. 10-2011-0093641
Mar. 7, 2012 (KR) .................. 10-2012-0023597

(51) Int. Cl.
G11C 16/06 (2006.01)
G11C 16/26 (2006.01)
G11C 11/56 (2006.01)
G11C 16/34 (2006.01)

(52) U.S. Cl.
CPC ............ *G11C 16/26* (2013.01); *G11C 11/5642* (2013.01); *G11C 16/3436* (2013.01); *G11C 16/349* (2013.01)

(58) Field of Classification Search
USPC ....................................... 365/185.21
See application file for complete search history.

(56) References Cited

U.S. PATENT DOCUMENTS

2011/0280084 A1* 11/2011 Radke et al. ............. 365/185.21
2012/0079355 A1* 3/2012 Patapoutian et al. ......... 714/780

FOREIGN PATENT DOCUMENTS

JP         2008-016092       1/2008
KR    10-2009-0097672 A      9/2009
KR    10-2009-0097673 A      9/2009

\* cited by examiner

*Primary Examiner* — Hoai V Ho
(74) *Attorney, Agent, or Firm* — Myers Bigel Sibley & Sajovec, P.A.

(57) ABSTRACT

A reading method of a flash memory, the reading method including: sensing hard data of a first target page by using a first hard read voltage; and generating soft data of the first target page by using at least one pair of, that is, two, first soft read voltages whose voltage levels are different from a voltage level of the first hard read voltage, while the flash memory performs a first operation on the hard data.

17 Claims, 35 Drawing Sheets

FIG. 4D
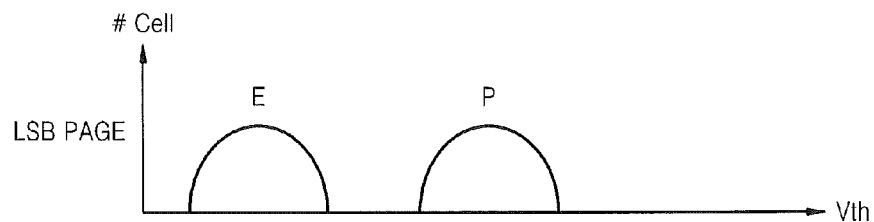
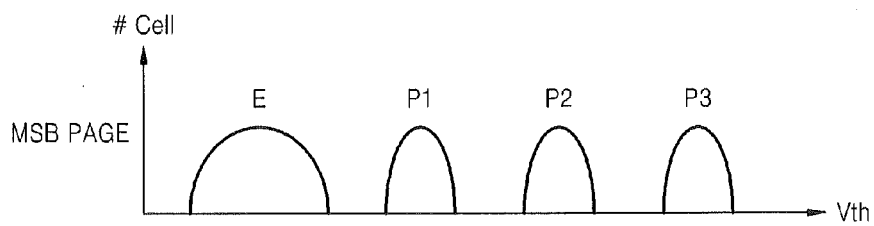
FIG. 4E
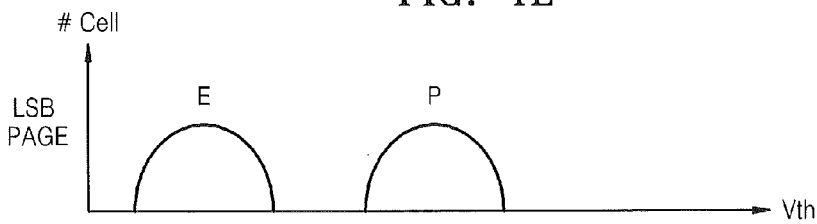
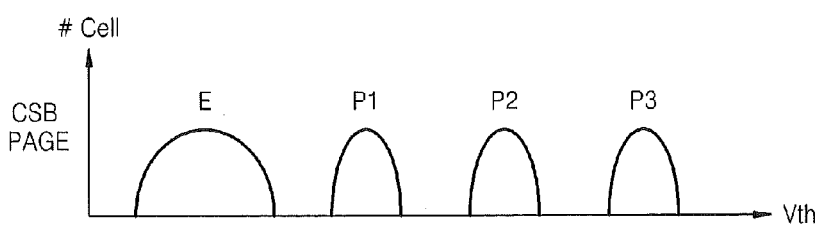
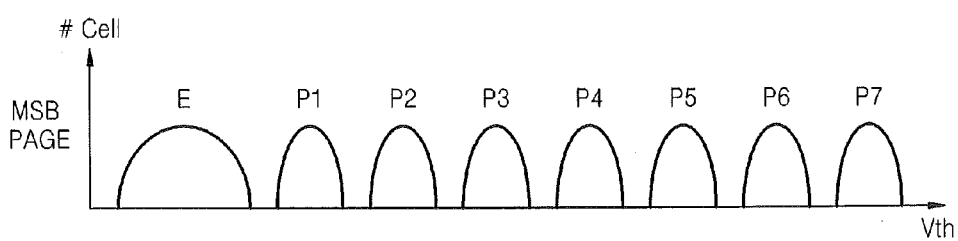

RTAB

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

FIG. 24

| Read Levle Table | Field0 | Field1 | Field2 | Field3 | Field4 | Field5 | Field6 | Field7 | No. |
|---|---|---|---|---|---|---|---|---|---|
| Initial Read | Uncor. | Uncor. | | Uncor. | Uncor. | Uncor. | Uncor. | | |
| Table Index1 | Correct | Uncor. | | Correct | Uncor. | Uncor. | Uncor. | | 2Hit |
| Table Index2 | Correct | Uncor. | | Correct | Correct | Correct | Uncor. | | 4Hit |
| Table Index3 | Correct | Correct | | Correct | Correct | Correct | Uncor. | | 5Hit |
| Table Index4 | Uncor. | Uncor. | | Correct | Uncor. | Uncor. | Correct | | 2Hit |

| Block Address | WO | LInd |
|---|---|---|
| a-1 | 7 | 3 |
| ⋮ | ⋮ | ⋮ |
| 1 | 2 | 1 |
| 0 | 4 | 0 |

WTAB

FIG. 27

RTABA

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

RTABB

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

RTABC

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

FLASH MEMORY AND READING METHOD OF FLASH MEMORY

REFERENCE TO PRIORITY APPLICATIONS

This application claims the benefit of Korean Patent Application Nos. 10-2011-0093641 and 10-2012-0023597, respectively filed on Sep. 16, 2011 and Mar. 7, 2012, in the Korean Intellectual Property Office, the disclosures of which are hereby incorporated herein by reference.

FIELD

This invention relates to flash memory and reading methods of flash memory and, more particularly, to flash memory that may improve error correction performance.

BACKGROUND

As flash memories are scaled down to meet requirements for higher integration, the number of bits stored in each memory cell increases, thereby reducing a read margin between program states and increasing read errors. Accordingly, attempts have been made to accurately and quickly correct read errors. However, as logic circuits for correcting read errors are attached to flash memories, sizes of chips of the flash memories are increased.

SUMMARY

The inventive concept provides a flash memory.

According to additional embodiments of the invention, a method of operating a nonvolatile memory device includes reading at least two pages of hard data from a first page of multi-bit nonvolatile memory cells in the nonvolatile memory device and performing an error detection operation on the first page of multi-bit nonvolatile memory cells. This error detection operation includes: (i) reading at least a pair of least significant bits of soft data from each of the multi-bit nonvolatile memory cells in the first page using at least a first pair of read voltages, (ii) reading at least two pairs of most significant bits of soft data from each of the multi-bit nonvolatile memory cells using at least second and third pairs of read voltages, and (iii) decoding the pair of least significant bits of soft data and the two pairs of most significant bits of soft data from each of the multi-bit nonvolatile memory cells in the first page to identify an error(s) in a programmed state of a multi-bit nonvolatile memory cell in the first page. This decoding operation may include performing respective bitwise Boolean operations (e.g., XNOR) on the pair of least significant bits of soft data and the two pairs of most significant bits of soft data from each of the multi-bit nonvolatile memory cells in the first page.

According to an aspect of the inventive concept, there is provided a reading method of a flash memory, the reading method including: sensing hard data of a first target page by using a first hard read voltage; and generating soft data of the first target page by using at least one pair of, that is, two, first soft read voltages whose voltage levels are different from a voltage level of the first hard read voltage, while the flash memory performs a first operation on the hard data. The first soft read voltages may be set by changing the voltage level of the first hard read voltage two times. The first soft read voltages may be set by changing at least one voltage level of at least one second hard read voltage for a second target page that is programmed to store bits whose number is different from the number of bits of the first target page. The first soft read voltages may be set by changing each voltage level of at least two second hard read voltages for the second target page, respectively. The first soft read voltages may be set by changing a voltage level of one second hard read voltage for the second target page. The voltage levels of the first soft read voltages may be set when an array of the flash memory is in a ready state.

The generating of the soft data of the first target page may include: detecting state information indicating a program state of the first target page from the hard data; and changing the state information to correspond to a read mode of the second target page. The changing of the state information may include changing the state information by using a test mode command of the flash memory. The first target page may be a page in which each of memory cells is programmed to store a single bit or up to a least significant bit of multi-bits.

The generating of the soft data of the first target page may include: transmitting a first soft value that is obtained by sensing the first target page by using one of the first soft read voltages to a first latch; and cooking the first soft value of the first latch and a second soft value that is obtained by sensing the first target page by using the other one of the first soft read voltages.

The cooking of the first soft value and the second soft value may include performing a bitwise operation on the first soft value and the second soft value. The cooking of the first soft value and the second soft value may include performing the cooking by using a test mode command of the flash memory.

The first target page may be a page in which each of memory cells is programmed to store up to a high-order bit of multi-bits, and the first hard read voltage is set to have two or more different voltage levels whose number corresponds to the number of the multi-bits.

The generating of the soft data of the first target page may include: transmitting to a first latch a first soft value that is obtained by sensing the first target page by using one of the first soft read voltages corresponding to a first voltage level of the first hard read voltage, and transmitting to a second latch a third soft value, wherein the third soft value is obtained by cooking the first soft value of the first latch and a second soft value, wherein the second soft value is obtained by sensing the first target page by using the other one of the first soft read voltages; transmitting to the first latch a first soft value that is obtained by sensing the first target page by using one of at least one pair of, that is, two, second soft read voltages corresponding to a second voltage level of the first hard read voltage, and obtaining a third soft value of the second soft read voltages by cooking the first soft value of the first latch and a second soft value that is obtained by sensing the first target page by using the other one of the second soft read voltages; and changing the third soft value of the second latch by cooking the third soft value of the second soft read voltages and the third soft value previously stored in the second latch.

The reading method may further include: changing the third soft value of the second latch by sequentially obtaining the soft value for all voltage levels of the first hard read voltage; and outputting the third soft value of the second latch as the soft data.

The first operation may be an operation of outputting the hard data from the flash memory. The first operation may be an operation of backing up the hard data stored in one of a plurality of latches of a buffer unit of the flash memory to another latch of the buffer unit. The reading method may further include continuously outputting the hard data that is backed up and the soft data.

When the flash memory comprises a plurality of memory cell arrays, the first target page may be included in each of the plurality of memory cell arrays, wherein the sensing the hard data and the generating the soft data for each first target page.

The reading method may further include sequentially and continuously outputting, for a sequence of the memory cell arrays, the hard data that is backed up of the first target page of each of the plurality of memory cell arrays and the soft data of the first target page of each of the plurality of memory cell arrays.

The generating of the soft data may include generating the soft data when there exists a read error of the first target page or the read error of the first target page is not corrected. The generating of the soft data may include generating the soft data when a read retry operation for correcting the read error of the first target page fails, wherein the read retry operation is repeatedly performed by changing read levels from a read level of one index to a last read level of a last index of a corresponding read retry table from among read retry tables provided respectively for endurance states of the flash memory, by referring to a wear-out table that includes blocks of the flash memory as indices.

The wear-out table may have as the degree of wear-out for each of the blocks an incremental step pulse erase (ISPE) loop count value used to erase the blocks of the flash memory in response to an erase command. The flash memory may not include a logic for generating the soft data, and generates the soft data by using a command set in the flash memory.

According to another aspect of the inventive concept, there is provided a reading method of a multi-level cell (MLC) NAND flash memory, the reading method including: sensing hard data of first target pages by using a first hard read voltage; sensing soft data by using a soft read voltage that is obtained by changing voltage levels of at least one pair of, that is, two, second hard read voltages for a page that is programmed to store bits whose number is greater than the number of the first target pages, while the hard data is backed up from a first latch to a second latch from among a plurality of latches included in a buffer unit of the flash memory, and storing the soft data in a third latch; and continuously outputting the soft data and the hard data that is backed up. According to another aspect of the inventive concept, there is provided a solid-state drive for performing a read operation of a flash memory by using the reading method.

BRIEF DESCRIPTION OF THE DRAWINGS

Exemplary embodiments of the inventive concept will be more clearly understood from the following detailed description taken in conjunction with the accompanying drawings in which:

FIGS. 23A through 24 are diagrams for explaining an error check and correction (ECC) decoding method according to an embodiment of the inventive concept;

FIG. 27 is a diagram illustrating a read retry table according to another embodiment of the inventive concept;

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

The inventive concept now will be described more fully hereinafter with reference to the accompanying drawings, in which elements of the inventive concept are shown. The inventive concept may, however, be embodied in many different forms and should not be construed as being limited to the exemplary embodiments set forth herein. Rather, these embodiments are provided so that this disclosure will be thorough and complete, and will fully convey the scope of the inventive concept to one of ordinary skill in the art.

The terminology used herein is for the purpose of describing particular embodiments only and is not intended to be limiting of exemplary embodiments of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as being limited to the particular shapes of regions illustrated herein but may include deviations in shapes that result, for example, from manufacturing.

Figure 1:
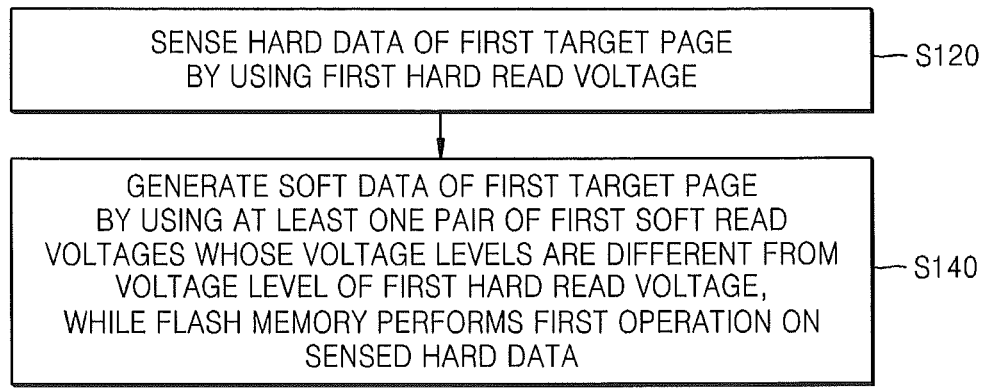
FIG. 1 is a flowchart illustrating a method of a flash memory, according to an embodiment of the inventive concept.
Figure 2:
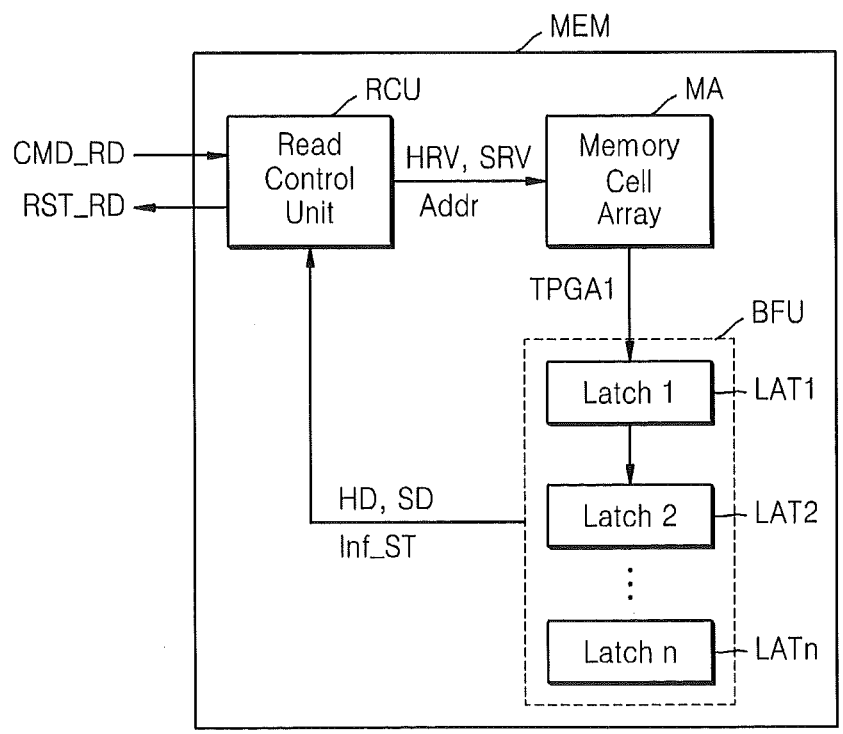
FIG. 2 is a block diagram illustrating the flash memory according to an embodiment of the inventive concept.

FIG. 1 is a flowchart illustrating a reading method of a flash memory MEM, according to an embodiment of the inventive concept. FIG. 2 is a block diagram illustrating the flash memory MEM according to an embodiment of the inventive concept. Referring to FIGS. 1 and 2, the reading method of the flash memory MEM includes operation S120 in which hard data HD of a first target page TPGA1 is sensed by using a first hard read voltage HRV, and operation S140 in which, while a first operation is performed on the hard data HD sensed by the flash memory MEM, soft data SD of the first target page TPGA1 is generated by using at least one pair of, that is, two, soft read voltages SRV, whose voltage levels are different from a voltage level of the first hard read voltage HRV. The first operation may be an operation of outputting the hard data HD sensed by the flash memory MEM from the flash memory MEM. Alternatively, the first operation may be an operation of backing up the hard data HD sensed by the flash memory MEM and then stored in one of a plurality of latches of a buffer unit BFU of the flash memory MEM to another latch of the buffer unit BFU, which will be explained in detail below. The flash memory MEM may be a NAND flash memory. Also, memory cells (not shown) of the flash memory MEM may be programmed to store one or more bits, various examples of which will be explained below with reference to FIGS. 4A through 4E.

The flash memory MEM may include a memory cell array MA including the first target page TPGA1, and the buffer unit BFU including a plurality of latches (e.g., first through nth latches LAT1 through LATn). The plurality of latches may be referred to as a plurality of page buffers or a plurality of data registers. The flash memory MEM includes the first through nth latches LAT1 through LATn, and thus an arbitrary operation may be performed on the hard data HD sensed by the flash memory MEM at the same time as the soft data SD of the first target page TPGA1 is generated, which will be explained in detail below.

The flash memory MEM may further include a read unit RCU, control logic (not shown), an input/output unit (not shown), and a power generating unit (not shown), an explanation of which will not be given. The read control unit RCU of FIG. 2 may be configured to have a combination of reading functions of the control logic, the input/output unit, and the power generating unit which may be included in the flash memory MEM. For example, the read control unit RCU may have a function of the input/output unit to receive a read command CMD_RD from the outside of the flash memory MEM and a function of the input/output unit to output a read result RST_RD corresponding to the read command CMD_RD to the outside. The read command CMD_RD may be transmitted from a memory controller Ctrl of FIG. 26, etc., and the read result RST_RD may be transmitted to the memory controller Ctrl.

The read control unit RCU outputs the read result RST_RD of the first target page TPGA1 from the memory cell array MA to the buffer unit BFU in response to the read command CMD_RD. In detail, the read control unit RCU applies a read voltage RV corresponding to the read command CMD_RD to the first target page TPGA1 corresponding to an address Addr of the read command CMD_RD. The read voltage RV and the address Addr included in the read command CMD_RD may be set by the memory controller Ctrl which will be explained below.

Figure 4A:
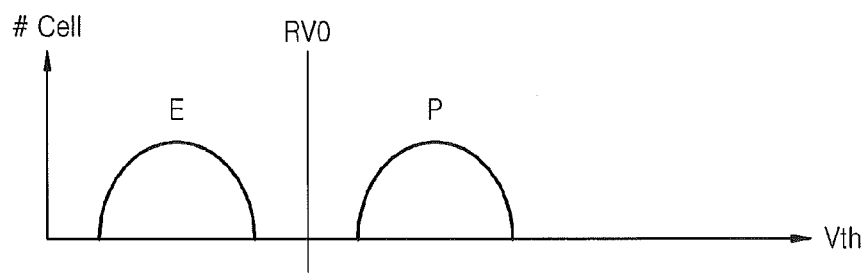
Figure 4B:
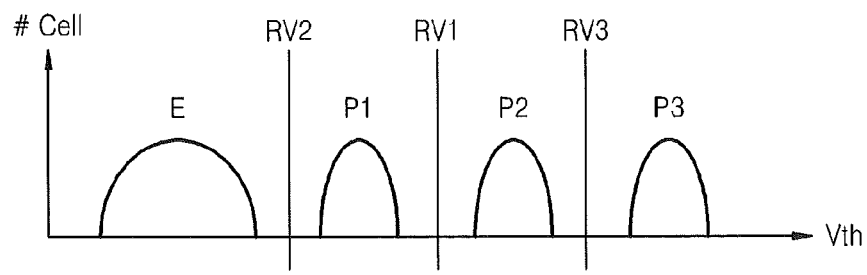

A voltage level of the read voltage RV applied to the first target page TPGA1 or a second target page TPGA2 may be set based on various read environments. For example, during an initial read operation, the read voltage RV may be set to an initial read voltage. When a read error is checked during the initial read operation, a read retry operation may be performed. In this case, the read voltage RV may be set to a read retry voltage that is obtained by adjusting the initial read voltage. If a page of a single-level cell (SLC) flash memory as shown in FIG. 4A is read, the read voltage RV may be set to a voltage RV0 between a distribution corresponding to an erase state E and a distribution of a program state P. Alternatively, if a least significant bit (LSB) in a 2-bit multi-level cell (MLC) as shown in FIG. 4B is read, the read voltage RV may be set to a voltage RV1 between a distribution corresponding to a first program state P and a distribution corresponding to a second program state P2.

Continuously referring to FIG. 2, as described above, the read control unit RCU may transmit the read result RST_RD of the first target page TPGA1 to, for example, the memory controller Ctrl. The hard data HD and the soft data SD are included in the read result RST_RD of the first target page TPGA1. Furthermore, in a MLC flash memory, state information Inf_ST indicating a program state of each page may be included. The state information Inf_ST will be explained in detail below.

The first target page TPGA1 may include memory cells connected to a word line of the memory cell array MA. In order to more clearly describe the first target page TPGA1 and the reading method of FIG. 1, a structure and an operation of the flash memory MEM will be explained first.

Figure 3A:
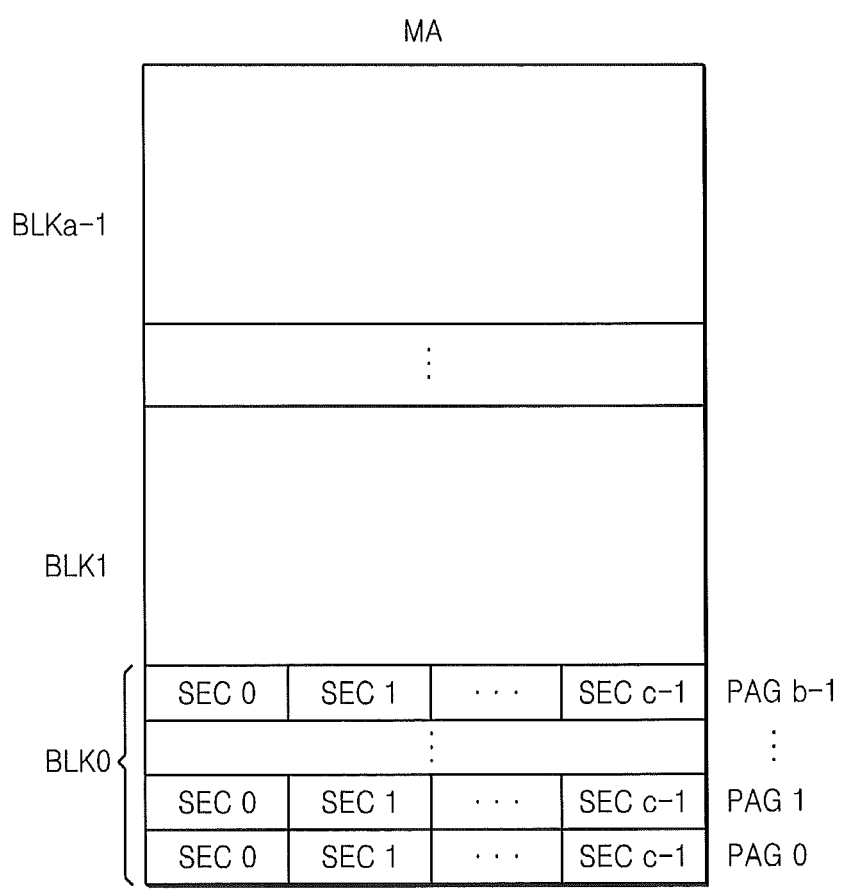
FIGS. 3A through 3C are diagrams illustrating a memory cell array of the flash memory of FIG. 2, FIGS. 4A through 4E are graphs illustrating distributions of memory cells of the flash memory of FIG. 2.
Figure 3B:
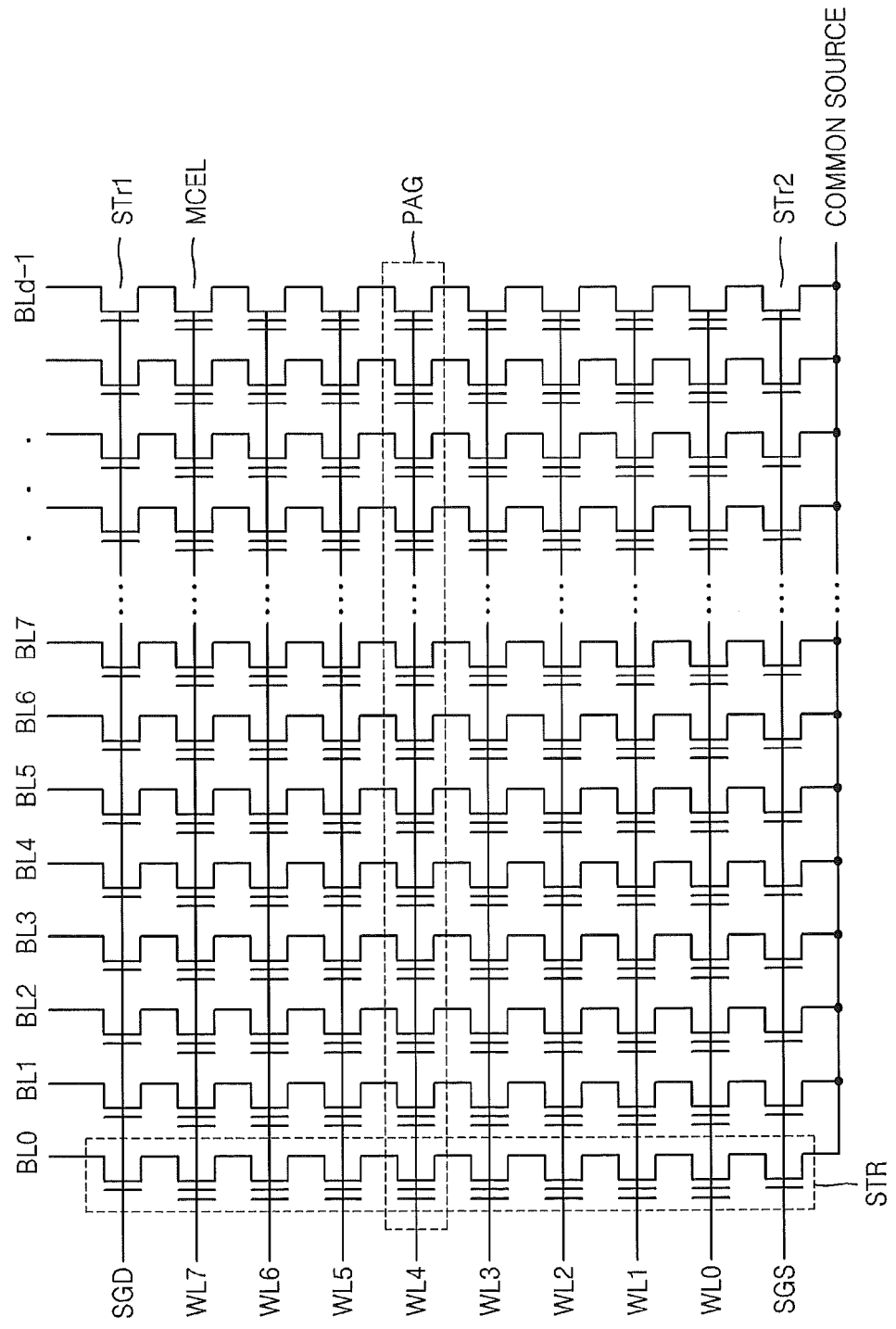
Figure 3C:
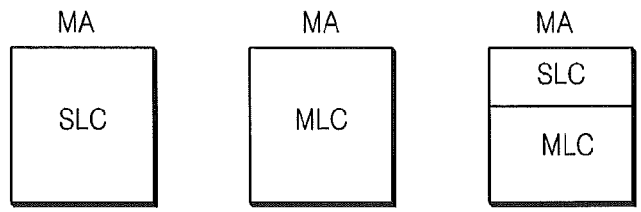

FIGS. 3A through 3C are diagrams illustrating the memory cell array MA of the flash memory MEM of FIG. 2. Referring to FIG. 3A, the memory cell array MA may include "a" (a is an integer equal to or greater than 2) blocks BLK0 through BLKa-1, each of the blocks BLK0 through BLKa-1 may include "b" (b is an integer equal to or greater than 2) pages PAG0 through PAGb-1, and each of the pages PAG0 through PAGb-1 may include "c" (c is an integer equal to or greater than 2) sectors SEC0 through SECc-1. Although the pages PAG0 through PAGb-1 and the sectors SEC0 through SECc-1 for one block BLK0 are illustrated in FIG. 3A for convenience of explanation, each of the other blocks BLK1 through BLKa-1 may have the same structure as that of the block BLK0.

If the memory cell array MA is a memory cell array of a NAND flash memory, each of the blocks BLK0 through BLKa-1 of FIG. 3A may be configured as shown in FIG. 3B. Referring to FIG. 3B, each of the blocks BLK0 through BLKa-1 may include d (d is an integer equal to or greater than 2) strings STR in each of which 8 memory cells MCEL are connected in series and the strings STR are arranged in a bit line direction of bit lines BL0 through BLd-1. Each of the strings STR may include a drain selection transistor STr1 and a source selection transistor STr2 connected to both ends of the memory cells MCEL that are connected in series. The NAND flash memory of FIG. 3B is erased in units of blocks, and is programmed in units of pages PAG corresponding to word lines WL0 through WL7. The page PAG of FIG. 3B may be the first target page TPGA1. In FIG. 3B, one block includes 8 pages PAGE of 8 word lines WL0 through WL7. Each of the blocks BLK0 through BLKa-1 of the memory cell array MA of FIG. 3A may include memory cells and pages whose numbers are different from numbers of the memory cells MCEL and the pages PAG illustrated in FIG. 3B. For example, each of the blocks BLK0 through BLKa-1 of the memory cell array MA may include 64 word lines. Also, the flash memory MEM of FIG. 2 may include a plurality of memory cell arrays each of which has the same structure and perform the same operation as those of the memory cell array MA.

Figure 4C:
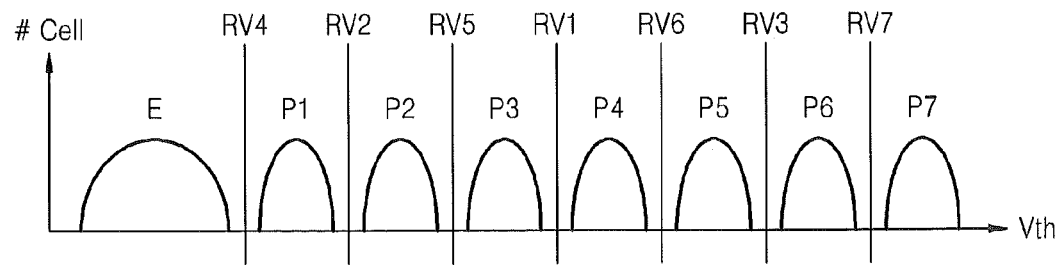

Referring to FIG. 3C, the memory cell array MA may include only an SLC area in which each memory cell is programmed to store one bit, or an MLC area in which each memory cell is programmed to store a plurality of bits. Memory cells of the MLC area may be programmed to store the same number of bits, or a different number of bits. For example, the memory cells of the MLC area may be programmed to store one of 2 bits and 3 bits. Alternatively, the memory cell array MA may include both the SLC area and the MLC area. In this case, the SLC area and the MLC area may be physically separated or logically separated due to the read command CMD_RD. Each of memory cells may have a threshold voltage Vth as shown in one of FIGS. 4A through 4E, according to the number of bits. FIG. 4A illustrates a cell distribution in an SLC flash memory in which each memory cell MCEL is programmed to store one bit, FIG. 4B illustrates a cell distribution of a 2-bit MLC flash memory in which each memory cell MCEL is programmed to store two bits, and FIG. 4C illustrates a cell distribution of a 3-bit MLC flash memory in which each memory cell MCEL is programmed to store three bits.

In detail, each of the memory cells MCEL in the SLC area has a threshold voltage included in one of the erase state E and the program state P of FIG. 4A according to a value of programmed data. Alternatively, each of the memory cells MCEL in a 2-bit MLC area in which each memory cell may store 2 bits has a threshold voltage included in one of the erase state E and first through third program states P1 through P3 of FIG. 4B. Alternatively, each of the memory cells MCEL in a 3-bit MLC area in which each memory cell may store 3 bits has a threshold voltage included in one of the erase state E and first through seventh program states P1 through P7 of FIG. 4C. However, the present embodiment is not limited thereto. Although not shown in FIGS. 4A through 4C, each memory cell MCEL of the memory cell array MA of FIG. 3A may be programmed to store 4 or more bits. Also, the flash memory MEM may include the memory cells MCEL that are programmed to store a different number of bits. Pages having different program states may be included in the MLC area. For example, a least significant bit (LSB) page programmed to store up to a low-order bit and a most significant bit (MSB) page programmed to store up to a high-order bit may be included in the 2-bit MLC area as shown in FIG. 4D. Alternatively, a central significant bit (CSB) page programmed to store up to a central bit, the LSB page, and the MSB page may be included in the 3-bit MLC area.

Figure 5:
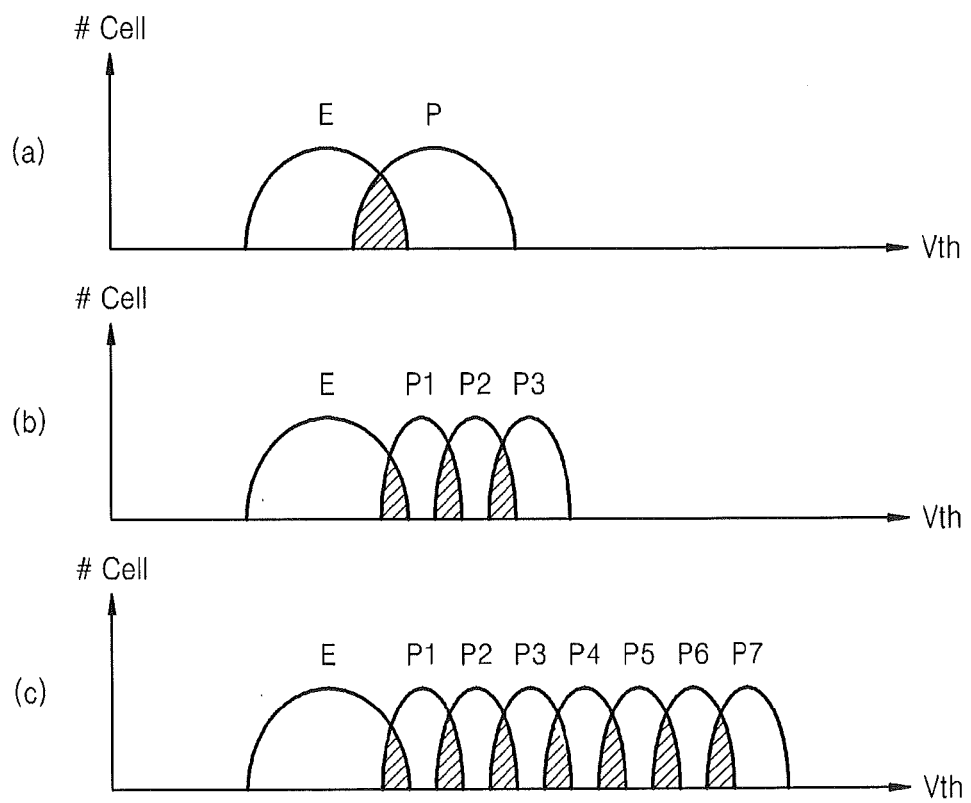
FIGS. 5A through 5C are graphs for explaining read errors.

Referring back to FIG. 2, a read error may be included in the read result RST_RD. The read error may be checked and corrected by an error check and correction (ECC) engine of the memory controller Ctrl. The read error may be generated when a distribution of each of a memory cell is distorted as shown in FIGS. 5A through 5C due to a change in a read environment of the flash memory MEM. For example, a value of a bit or data programmed in a memory cell having the threshold value Vth of an overlapped area between adjacent distributions may be incorrectly determined. For example, when distributions of cells are moved as shown in FIGS. 5A through 5C and a read operation is performed by using read voltages RV0 through RV7 set for the distributions of FIGS. 4A through 4C, a read error may be generated in a hatched area of any of FIGS. 5A through 5C and thus a read operation may be performed by using data other than programmed data. A read environment may be changed due to read disturbance or retention characteristics of the flash memory MEM.

A method of correcting a read error by performing soft decision coding on the first target page TPGA1 by using an existing command of the flash memory MEM without using a hardware logic will be explained in detail. A reading method for the first target page TPGA1 included in the SLC area will be explained and then a reading method for the first target page TPGA1 included in the MLC area will be explained.

Figure 6:
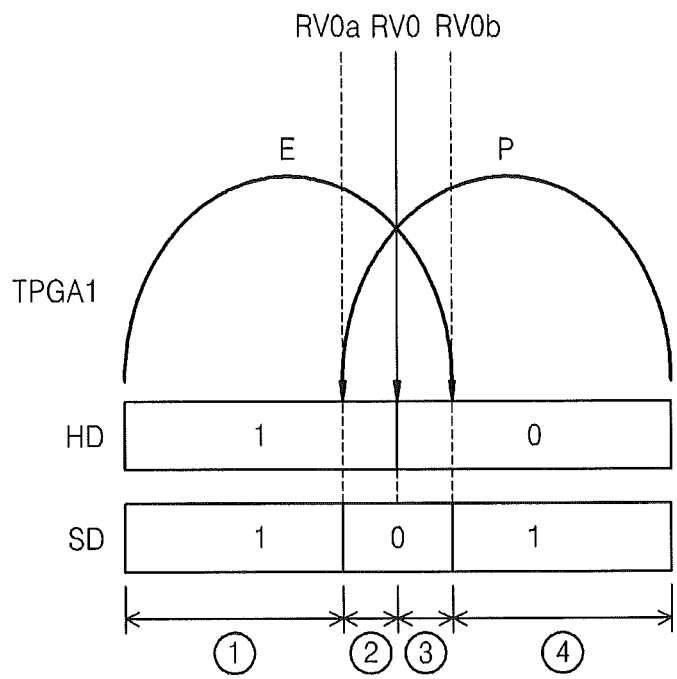
FIG. 6 is a diagram for explaining the reading method of FIG. 1 for a first target page included in a single-level cell (SLC) area.

FIG. 6 is a diagram for explaining the reading method of FIG. 1 for the first target page TPGA1 included in the SLC area. Referring to FIG. 6, each of memory cells included in the first target page TPGA1 may be programmed to store a single bit. In this case, the hard data HD of the first target page TPGA1 may be sensed by using the first hard read voltage RV0. Voltage levels of two soft read voltages RV0a and RV0b may be set by changing a voltage level of the first hard read voltage RV0 two times (e.g., RV0a<RV0<RV0b).

Figure 7:
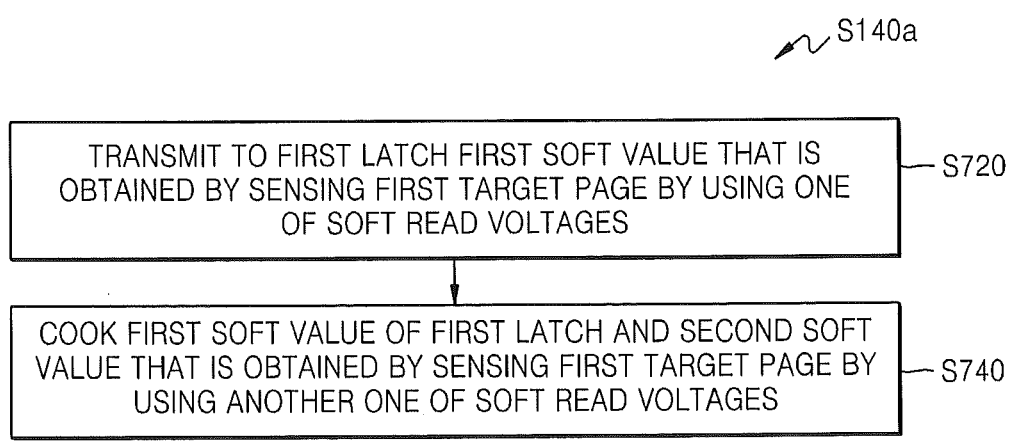
FIGS. 7 and 8 are diagrams illustrating a method of generating soft data, according to an embodiment of the inventive concept.
Figure 8:
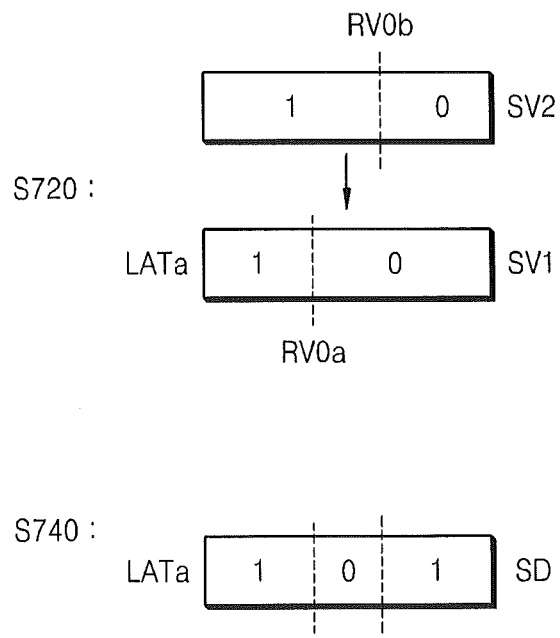

The voltage levels of the soft read voltages RV0a and RV0b may be set when the memory cell array MA of the flash memory MEM is in a ready state. When the memory cell array MA of the flash memory MEM is in a ready state (for example, when a logic level of a signal Array RnB is a logic high level), it means that a read operation and a program operation are not performed on the memory cell array MA. A voltage level of a soft read voltage may be set when the memory cell array MA is in a ready state even during a read operation performed on the first target page TPGA1 in the MLC area, and thus a repeated explanation thereof will not be given. FIGS. 7 and 8 are diagrams illustrating a method of generating soft data, according to an embodiment of the inventive concept.

Referring to FIGS. 6 through 8, operation S140a in which the soft data SD of the first target page TPGA1 included in the SLC area is generated may include operation S720 in which a first soft value SV1 that is obtained by sensing the first target page TPGA1 by using one (e.g., RV0a) of the soft read voltages RV0a and RV0b is transmitted to a first latch LATa, and operation S740 in which the first soft value SV1 of the first latch LATa and a second soft value SV2 that is obtained by sensing the first target page TPGA1 by using the remaining one (e.g., RV0b) of the soft read voltages RV0a and RV0b are cooked. The first latch LATa may be one of the first through nth latches LAT1 through LATn of FIG. 2.

As shown in FIG. 8, the first soft value SV1 is obtained by sensing a memory cell having a threshold value lower than one soft read voltage RV0a as 1 and a memory cell having a threshold value higher than the soft read voltage RV0a as 0. Likewise, the second soft value SV2 is obtained by sensing a memory cell having a threshold voltage lower than the other soft read voltage RV0b as 1 and a memory cell having a threshold voltage higher than the soft read voltage RV0b as 0.

The soft data SD may be generated by cooking the first soft value SV1 and the second soft value SV2. Cooking may be performed by performing a bitwise operation on the first soft value SV1 and the second soft value SV2 using Boolean operations (e.g., XNOR of the values), to thereby generate error detection information. In FIG. 8, an XNOR operation is performed on the first soft value SV1 and the second soft value SV2 to generate the soft data SD. The first soft value SV1 and the second soft value SV2 may be cooked by using a test mode command of the flash memory MEM. Cooking may be performed by using the test mode command even during a read operation performed on the first target page TPGA1 in the MLC area, and thus a repeated explanation thereof will not be given.

As described above, the hard data HD and the soft data SD of the first target page TPGA1 in the SLC area are sensed and generated. Although a method of outputting the hard data HD and the soft data SD is not described, the method may be performed in the same manner as that described for the first target page TPGA1 in the MLC area.

Figure 9:
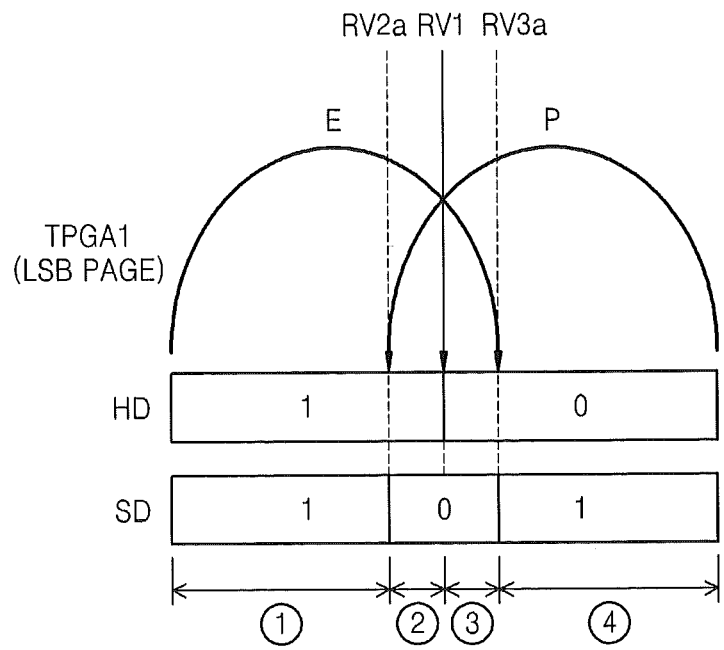
FIG. 9 is a diagram for explaining the reading method when the first target page in a multi-level cell (MLC) area is a least significant bit (LSB) page of FIG. 4D or 4E.

A reading method for the first target page TPGA1 in the MLC area will now be explained. FIG. 9 is a diagram for explaining the reading method when the first target page TPGA1 in the MLC area is the LSB page of FIG. 4D or 4E. Referring to FIG. 9, the first target page TPGA1 is an LSB page programmed to store up to a low-order bit. In this case, the hard data HD and the soft data SD are the same as those described with reference to FIG. 6. However, as shown in FIG. 9, the voltage RV1 which is referred to as a first hard read voltage is a read voltage which may be used to determine an LSB of FIG. 4B or 4C. A soft read voltage for the first target page TPGA1 in the MLC area may be set by changing a voltage level of a second hard read voltage of the second target page TPGA2 that is programmed to store bits whose number is different from the number of bits programmed in each of memory cells of the first target page TPGA1. In FIG. 9, the second target page TPGA2 may be the MSB page of FIG. 4D or 4E, or the CSB page of FIG. 4E. The second hard read voltage may be the read voltage RV2 and the read voltage RV3 by using which an MSB of FIG. 4B or a CSB of FIG. 4C may be determined. One pair of, that is, two, soft read voltages RV2a and RV3a of FIG. 9 are set by changing voltage levels of the second hard read voltages RV2 and RV3 of the second target page TPGA2 (the MSB page or the CSB page). Although the second target page TPGA2 is a page that is programmed to store bits whose number is greater than the number of bits of the first target page TPGA1, the present embodiment is not limited thereto. Also, a soft read voltage may be set by changing a voltage level of one second hard read voltage, instead of two second hard read voltages, for the second target page TPGA2 two times.

Figure 10:
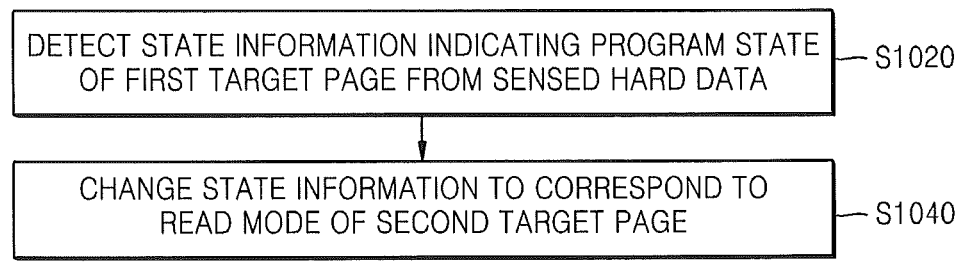
FIG. 10 is a flowchart illustrating a method of generating and changing state information, according to an embodiment of the inventive concept.

FIG. 10 is a flowchart illustrating a method of generating and changing state information, according to an embodiment of the inventive concept. Referring to FIG. 10, in order to generate soft data of the first target page TPGA1 that is an LSB page, when a soft read voltage is generated by changing a voltage level of a second hard read voltage of the second target page TPGA2 as shown in FIG. 9, operation S1020 in which the state information Inf_ST of FIG. 2 indicating a program state of the first target page TPGA1 is detected from sensed hard data and operation S1040 in which the state information Inf_ST is changed to correspond to a read mode of the second target page may be added.

Figure 11:
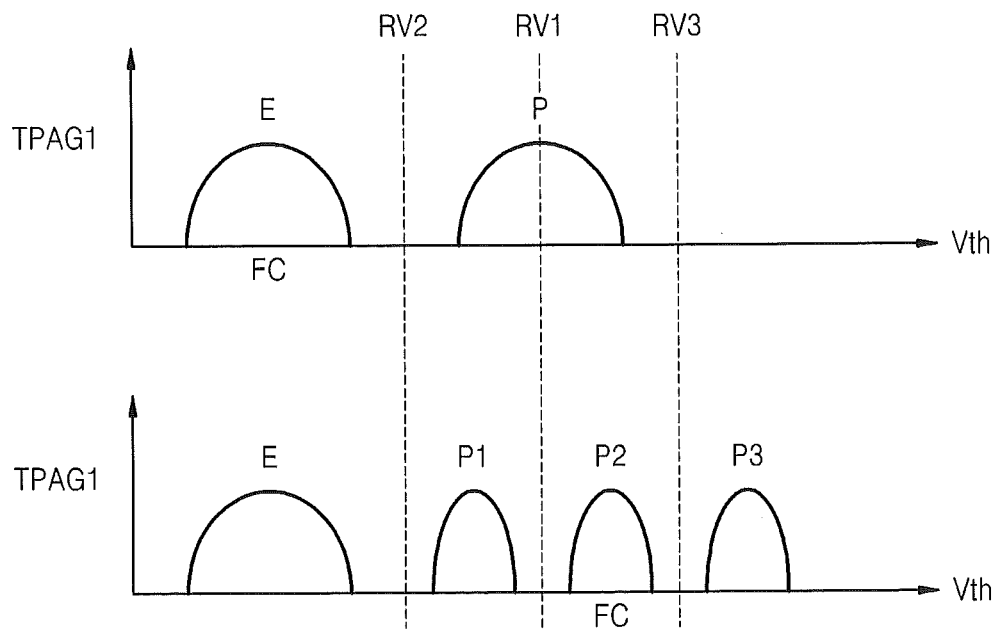
FIG. 11 illustrates graphs for explaining a method of detecting the state information indicating a program state of the first target page from sensed hard data in the method of FIG. 10.

FIG. 11 illustrates graphs that explain an operation of detecting the state information Inf_ST indicating a program state of the first target page TPGA1 from the sensed hard data in the method of FIG. 10. Referring to FIG. 11, the state information Inf_ST of FIG. 2 may be detected according to a type and a value of a flag cell. For example, when a read operation is performed on the first target page TPGA1 in a 2-bit MLC area and a flag cell FC having a value of 1 is detected from the sensed hard data, it may be determined that the first target page TPGA1 is an LSB page. However, when the flag cell FC having a value of 0 is detected from the sensed hard data, it may be determined that the first target page TPGA1 is an MSB page. A plurality of the flag cells FC may be provided in the first target page TPGA1.

However, although the state information Inf_ST is detected by using the flag cell FC, the present embodiment is not limited thereto. For example, the state information Inf_ST may be detected by counting program states of the first target page TPGA1. For example, when the state information Inf_ST about a program state of the first target page TPGA1 in a 3-bit MLC area is detected, the number of the seventh program states P7 of FIG. 4C included in the first target page TPGA1 may be counted. If the number of the seventh program states P7 included in the first target page TPGA1 is close to 0, it may be determined that the first target page TPGA1 is not an MSB page.

The detected state information Inf_ST may be stored in an arbitrary register (not shown). The flash memory MEM may be changed by using a test mode command. For example, the memory controller Ctrl may be forced to determine that the first target page TPGA1 is an MSB page by changing the state information Inf_ST indicating that the first target page TPGA1 is an LSB page. Accordingly, the second hard read voltage of the second target page TPGA2 may be used for the first target page TPGA1.

Operations S1020 and S1040 of the method of FIG. 10 may be performed after hard data is sensed and before a soft read voltage is set. Operations S1020 and S1040 of the method of FIG. 10 may also be used even when the first target page is an MSB page, and thus a repeated explanation thereof will not be given.

Figure 12:
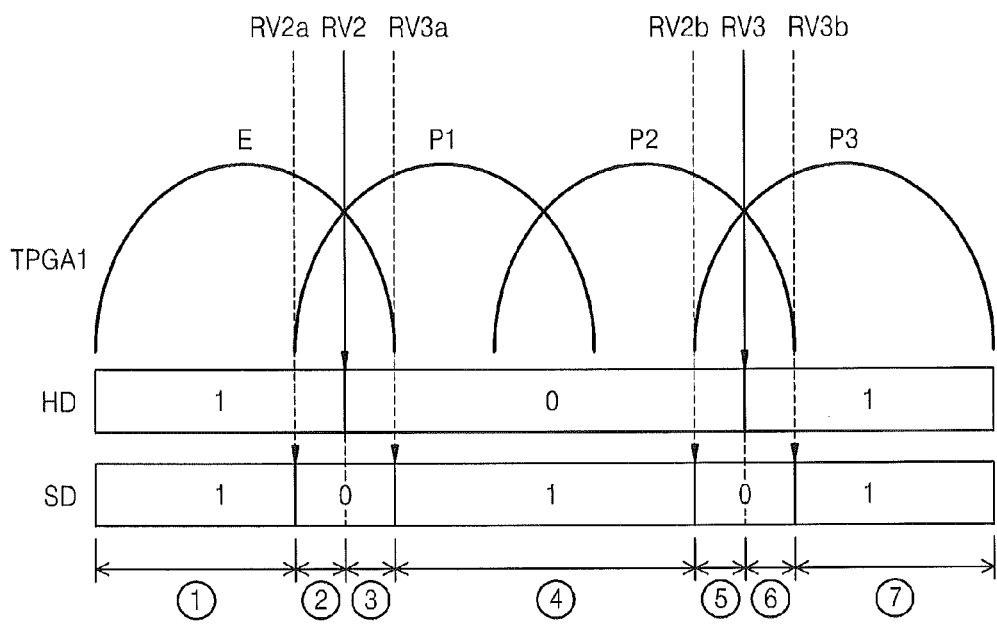
FIG. 12 is a graph for explaining the reading method when the first target page is programmed to store up to a high-order bit of multi-bits.

FIG. 12 is a graph for explaining the reading method when the first target page TPGA1 is programmed to store up to a high-order bit of multi-bits. Referring to FIG. 12, for example, the first target page TPGA1 may be a page programmed to store up to an MSB of 2-bit program data. In this case, a first hard read voltage may be set to two or more voltage levels corresponding to the number of the multi-bits. Since FIG. 12 illustrates that the first target page TPGA1 is an MSB page for a 2-bit MLC, first hard read voltages RV2 and RV3 having two different voltage levels are set. Also, in FIG. 12, soft read voltages RV2a, RV3a, RV2b and RV3b are set by changing voltage levels of the first hard read voltages RV2 and RV3 two times. However, in a reading method when the first target page TPGA1 is programmed to store up to a high-order bit of multi-bits, a soft read voltage may be set according to one of the afore-described various embodiments. In the reading method of FIG. 12, like in FIGS. 6 through 8, the first soft value SV1 and the second soft value SV2 are formed by sensing a memory cell as 1 or 0 according to a threshold voltage of the memory cell and a voltage level of a soft read voltage. However, while the soft data SD of FIGS. 6 through 8 is generated by performing a bitwise operation on the first soft value SV1 and the second soft value SV2, the soft data SD of FIG. 12 is generated by using third soft values SV3 obtained by performing a bitwise operation on the first soft value SV1 and the second soft value SV2.

Figure 13:
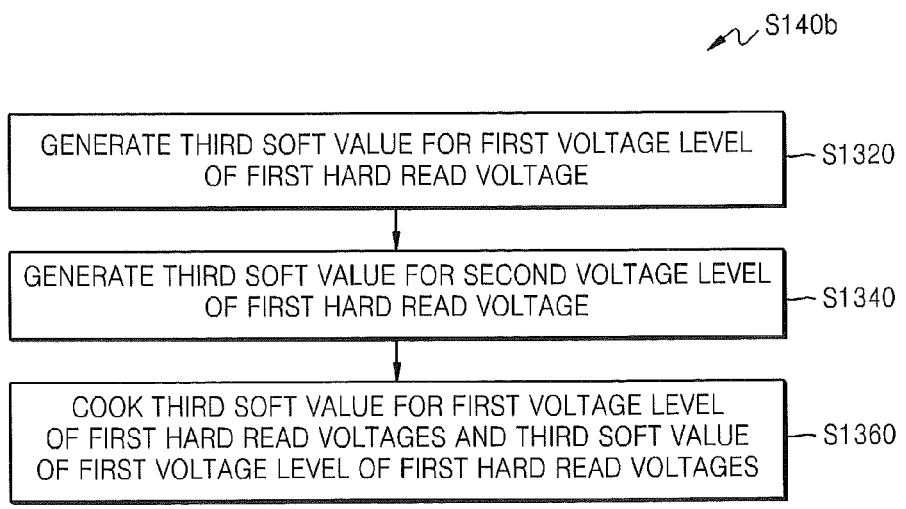
FIG. 13 is a flowchart illustrating a method of generating soft data of the first target page in the reacting method of FIG. 12.

FIG. 13 is a flowchart illustrating a method S140b of generating soft data of the first target page TPGA1 in the reading method of FIG. 12. FIGS. 14A through 14D are diagrams for explaining an operation of generating soft data in the method of FIG. 13. Referring to FIGS. 12 through 14C, the method S140b of generating soft data of the first target page TPGA1 programmed to store up to a high-order bit of multi-bits (for example, an MSB of a 2-bit MLC) includes operation S1320 in which a third soft value SV3-1 corresponding to a first voltage level RV2 of the first hard read voltages RV2 and RV3 is generated, operation S1340 in which a third soft value SV3-2 corresponding to a first voltage level RV3 of the first hard read voltages RV2 and RV3 is generated, and operation S1360 in which the third soft value SV3-1 corrsponding to the first voltage level RV2 of the first hard read voltages RV2 and RV3 and the third soft value SV3-2 of the first voltage level RV3 of the first hard read voltages RV2 and RV3 are cooked.

Figure 14A:
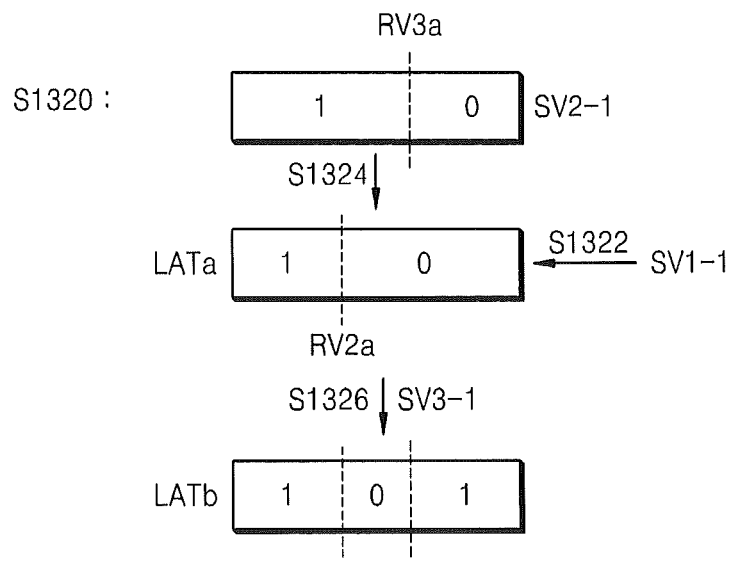
FIGS. 14A through 14D are diagrams for explaining an operation of generating soft data in the method of FIG. 13.
Figure 14B:
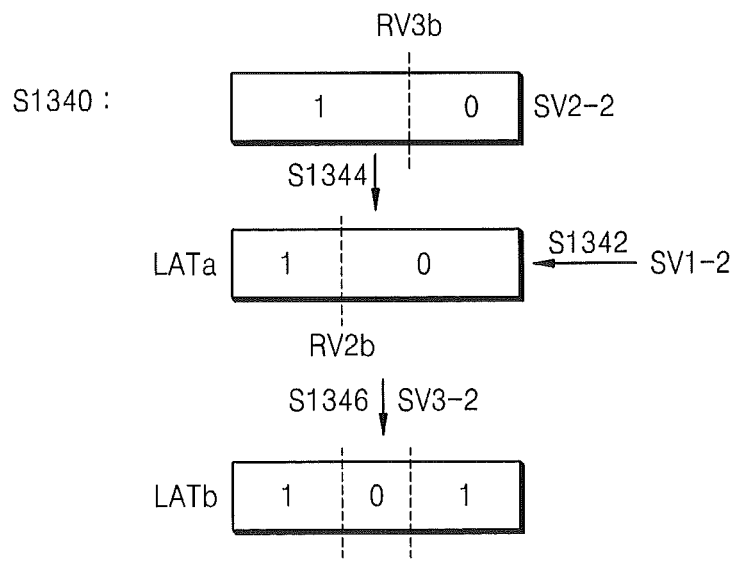
Figure 14C:
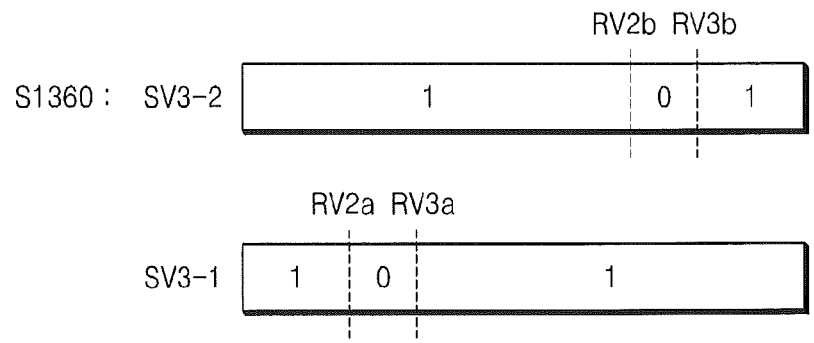

For example, operation S1320 in which the third soft value SV3-1 of the first voltage level RV2 of the first hard read voltages RV2 and RV3 is generated may be performed as shown in FIG. 14A. In detail, operation S1320 may include operation S1322 in which the first soft value SV1-1 obtained by sensing the first target page TPGA1 by using one (e.g., RV2a) of two soft read voltages RV2a and RV3a corresponding to the first voltage level RV2 of the first hard read voltages RV2 and RV3 is transmitted to a first latch LATa, operation S1324 in which the second soft value SV2-1 of the first target page TPGA1 is sensed by using the other one (e.g., RV3a) of the two soft read voltages RV2a and RV3a, and operation S1326 in which the third soft value SV3-12 of the soft read voltages RV2a and RV3a obtained by cooking the first soft value SV1-1 of the first latch LATa and the second soft value SV2-1 is transmitted to a second latch LATb. The first latch LATa and the second latch LATb may be one of the first through nth latches LAT1 through LATn of FIG. 2. In this case, there is no limitation in physical positions of the first latch LATa and the second latch LATb in the first through nth latches LAT1 through LATn of FIG. 2. Operation 51340 in which the third soft value SV3-2 of the second voltage level RV3 of the first hard read voltage RV2 and RV3 is generated may be performed as shown in FIG. 14B. In detail, operation S1340 may include operation S1342 in which the first soft value SV1-2 obtained by sensing the first target page TPGA1 by using one (e.g., RV2b) of two soft read voltages RV2b and RV3b corresponding to the second voltage level RV3 of the first hard read voltages RV2 and RV3 is transmitted to the first latch LATa, operation S1344 in which the second soft value SV2-2 of the first target page TPGA1 is sensed by using the other one (e.g., RV3b) of the two soft read voltages RV2b and RV3b, and operation S3146 in which the third soft value SV3-2 of the soft read voltages RV2b and RV3b obtained by cooking the first soft value SV12 of the first latch LATa and the second soft value SV2-b is transmitted to the second latch LATb. A bitwise operation is performed on the third soft values SV3-1 and SV3-2 as shown in FIG. 14C. In this case, when the third soft value SV3-2 is transmitted to the second latch LATb in operation S1346, a bitwise operation of operation S1360 may be performed on the third soft value SV3-1 stored in the second latch LATb in operation S1326. A bitwise operation in FIGS. 14A through 14C may be an XNOR operation as described above with reference to FIG. 6 or 8.

Figure 14D:
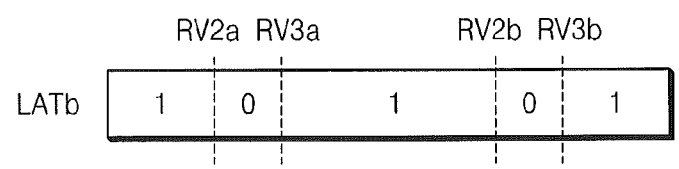

Referring to FIG. 14D, a result obtained after performing the bit operation on the third soft values SV3-1 and SV3-2 in operation S1360 is stored in the second latch LATb. Although the first target page TPGA1 is an MSB page of a 2-bit MLC, the present embodiment is not limited thereto. As described above, the first target page TPGA1 may be an MSB page or a CSB page of a 3 or more-bit MLC. In this case, first hard read voltages for the first target page TPGA1 may be generated to have more various voltage levels than those illustrated in FIG. 12.

Figure 15:
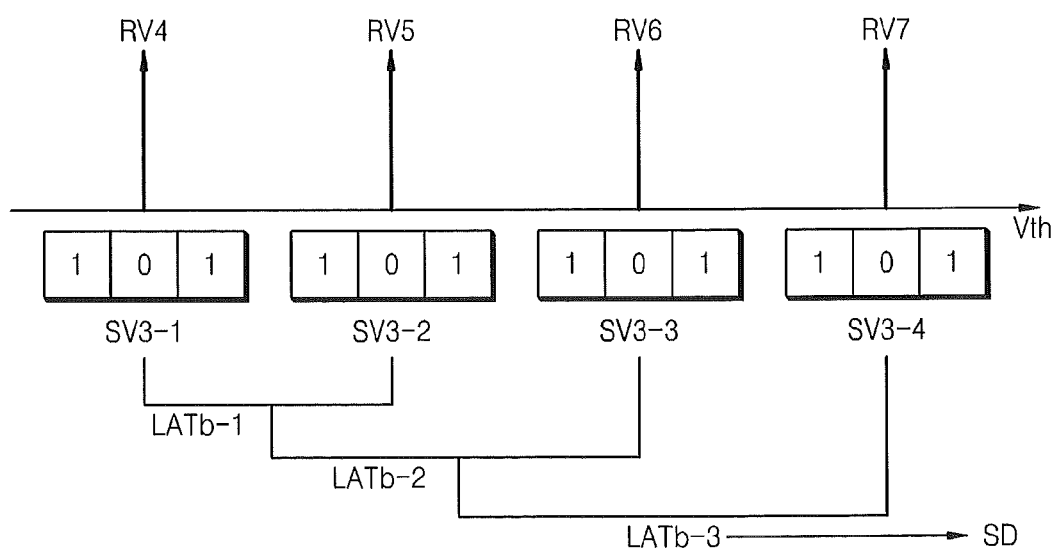
FIG. 15 is a diagram for explaining the reading method when the first target page is a most significant bit (MSB) page of a 3-bit MLC.

FIG. 15 is a diagram for explaining the reading method when the first target page TPGA1 is an MSB page of a 3-bit MLC. For convenience, only the first hard read voltage HRV, that is, first hard read voltages RV4, RV5, RV6, and RV7, having four voltage levels of the first target voltage TPGA1 and the soft data SD corresponding to the first hard read voltage HRV are illustrated in FIG. 15.

Figure 16:
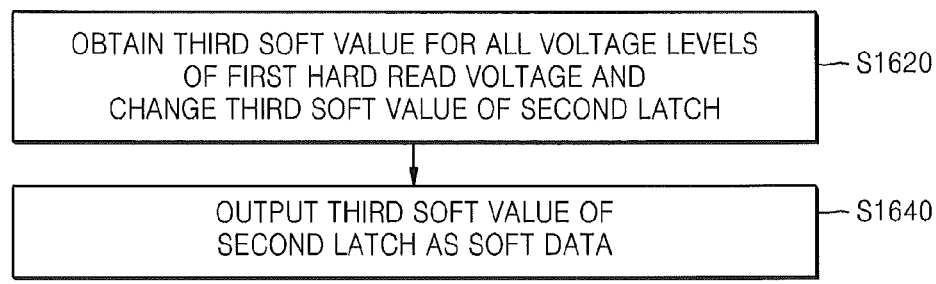
FIG. 16 is a flowchart illustrating a method of generating soft data when a first hard read voltage is provided to have a plurality of levels.
Figure 17A:
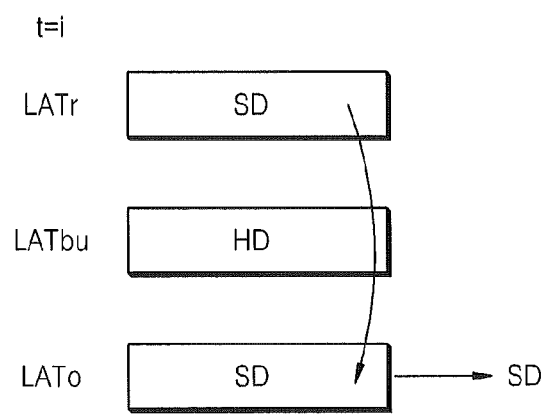
FIGS. 17A, 17B, and 18 are diagrams illustrating a case where soft data and hard data are output in the reading method of the flash memory.
Figure 17B:
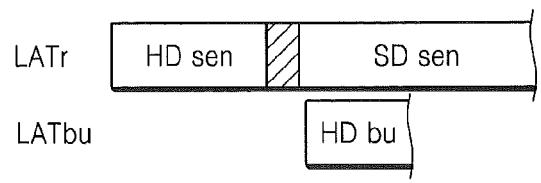

FIG. 16 is a flowchart illustrating a method of generating the soft data SD when a first hard read voltage HRV is provided to have a plurality of voltage levels. Referring to FIGS. 15 and 16, the method may include operation S1620 in which a third soft value of the second latch LATb is changed from LATb-1 to LATb-2 to LATb-3 by sequentially obtaining third soft values SV3-1, SV3-2, SV3-3, and SV3-4 for all of a plurality of voltage levels of the first hard read voltages RV4, RV5, RV6, and RV7, and operation S1640 in which the third soft value LATb-3 of the second latch LATb is output as the soft data SD. In this case, a method of obtaining the third soft values SV3-1, SV3-2, SV3-3, and SV3-4 for the first hard read voltages RV4, RV5, RV6, and RV7 may be the same as that described with reference to FIGS. 12 through 14D. FIGS. 17A and 17B are diagrams illustrating a case where soft data is output in the reading method of the flash memory MEM.

Figure 18:
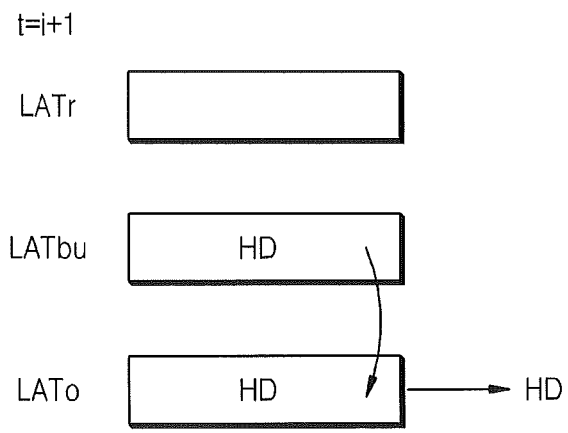

Referring to FIGS. 17A and 17B, after the hard data HD of the first target page PTGA1 of the memory cell array MA is sensed, while the hard data HD is backed up from a receiver latch LATr to a backup latch LATbu, the soft data SD of the first target page PTGA1 of the memory cell array MA may be sensed. However, after the hard data HD is sensed and before the soft data SD is sensed, a voltage level of a soft read voltage may be changed or the state information Inf_ST may be detected and changed. However, the present embodiment is not limited thereto. The hard data HD may be output to the outside of the flash memory MEM while the soft data SD is sensed. As such, in a cache reading method, the soft data SD may be sensed at the same time as the flash memory MEM performs an operation on the hard data HD by using a plurality of latches. The soft data SD of FIG. 17A may be output from an output latch LATo at a time t=i. Referring to FIG. 18, the hard data HD that is backed up to the backup latch LATbu may be output from the output latch LATo at a time t=i+1 after the soft data SD. However, the present embodiment is not limited thereto. Unlike in FIGS. 17A and 18, the hard data HD may be first output and then the soft data SD may be output. Physical positions of the receiver latch LATr, the backup latch LATbu, and the output latch LATo are not limited to those in FIGS. 17A, 17B, and 18. Each of the receiver latch LATr, the backup latch LATbu, and the output latch LATo may be one of the first through nth latches LAT1 through LATn of FIG. 2.

Figure 19:
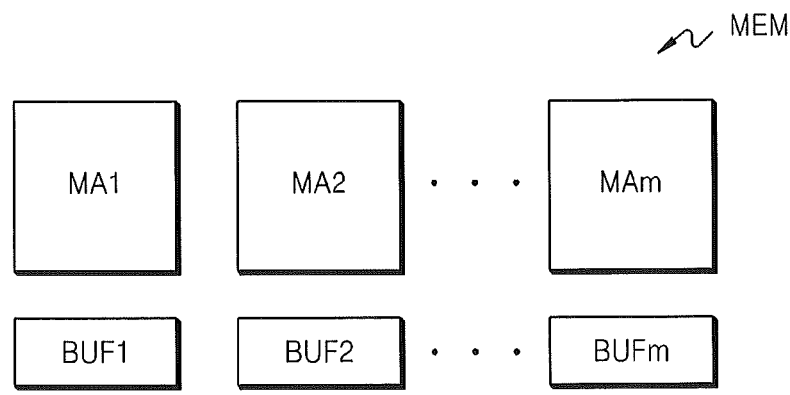
FIG. 19 is a block diagram illustrating the flash memory including a plurality of memory cell arrays.
Figure 20:
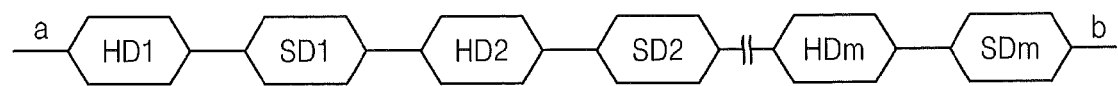
FIG. 20 is a diagram illustrating a case where hard data and soft data are output in the flash memory of FIG. 19.

FIG. 19 is a block diagram illustrating the flash memory MEM including a plurality of memory cell arrays. FIG. 20 is a diagram illustrating a case where hard data and soft data are output in the flash memory MEM of FIG. 19. Referring to FIGS. 19 and 20, the flash memory MEM may include a plurality of memory cell arrays MA1 through MAm, and buffer units BUF1 through BUFm. In this case, the first target page TPGA1 may be included in each of the memory cell arrays MA1 through MAm, and hard data HD1 through HDm may be sensed and soft data SD1 through SDm may be generated according to various embodiments for the first target page TPGA1.

The hard data HD1 through HDm and the soft data SD1 through SDm sensed or generated in each of the plurality of memory cell arrays MA1 through MAm may be continuously output as shown in FIGS. 17A and 18. In particular, as shown in FIG. 20, the hard data HD1 through HDm and the soft data SD1 through SDm may be output sequentially and continuously for the plurality of memory cell arrays MA1 through MAm. For example, after the hard data HD1 and the soft data SD1 are output for the first memory cell array MA1, the hard data HD2 and the soft data SD2 may be output for the second memory cell array MA2 (in a direction toward b). Alternatively, after the hard data HD2 and the soft data SD2 are output for the second memory cell array MA2, the hard data HD1 and the soft data SD1 may be output for the first memory cell array MA1 (in a direction toward a). As the hard data HD1 through HDm and the soft data SD1 through SDm are sequentially output for the plurality of memory cell arrays MA1 through MAm, the memory controller Ctrl that receives the hard data HD1 through HDm and the soft data SD1 through SDm does not need to include a buffer for hard data and soft data for all of memory cell arrays, and may include only a buffer for hard data and soft data for one memory cell array to reduce the size of the memory controller Ctrl. However, the present embodiment is not limited thereto.

The reading method of the flash memory MEM may perform soft decision coding by using a preset command (a read command or a test mode command) without employing logic for soft decision coding. Also, the reading method of the flash memory MEM may prevent overhead by sensing a soft read voltage by using a cache reading method as described above with reference to FIG. 17B. Furthermore, the reading method of the flash memory MEM may reduce the size of the memory controller Ctrl (the number of buffers required by the memory controller Ctrl) by improving a scheme of outputting hard data and soft data as described above with reference to FIG. 20. A read error may be corrected by combining hard data and soft data respectively sensed and generated and then output from the flash memory MEM by using the memory controller Ctrl. However, the soft data may be generated when a read error is generated in the first target page TPGA1. Alternatively, the soft data may be generated when a read error in the first target page TPGA1 is not corrected by using a method described below.

Figures 21, 22:
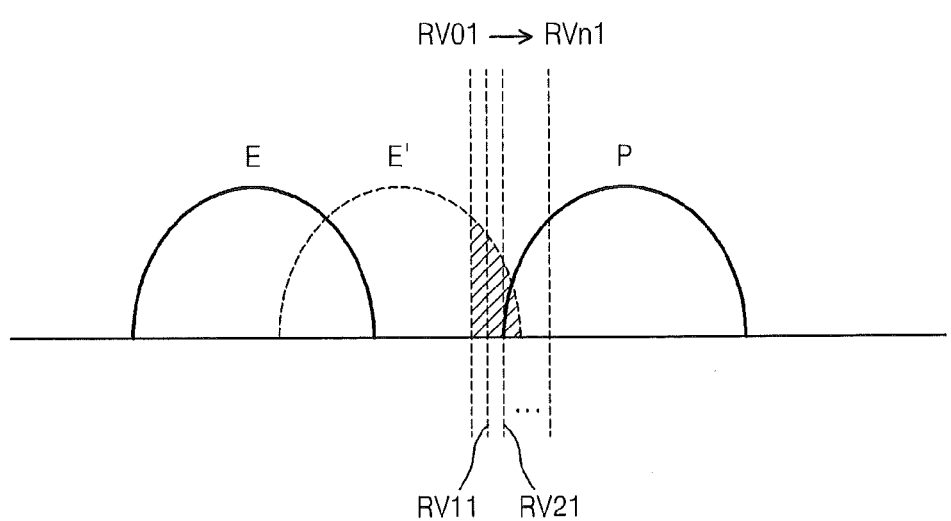
FIG. 21 is a read retry table according to an embodiment of the inventive concept.
FIG. 22 is a graph for explaining a case where a read retry operation fails.

FIG. 21 is a read retry table RTAB according to an embodiment of the inventive concept. Referring to FIG. 21, in the read retry table RTAB, each index includes a plurality of read levels. For example, each index includes 3 read levels REVL1, REVL2, and REVL3. For example, an index 0 of the read retry table RTAB includes RV11, RV12, and RV13 as values of the read levels REVL1, REVL2, and REVL3, and an index 1 includes RV21, RV22, and RV23 as values of the read levels REVL1, REVL2, and REVL3. This is because a plurality of read levels are required to read an MLC in the case of an MLC flash memory. For example, in order to distinguish 4 states (cell distributions) as shown in FIG. 4B, values of 3 different read levels are required. Until a read error is corrected, the flash memory MEM performs a read retry operation by sequentially changing read levels from a read level of one index to a read level of a next index. For example, when a read retry operation is performed by using the read levels RV11, RV12, and RV13 of the index 0 of the read retry table RTAB but an error is not corrected, a read retry operation may be performed by using the read levels RV21, RV22, and RV23 of the index 1 of the read retry table RTAB. When the error is not yet corrected, a read retry operation may be performed by using read levels RV31, RV32, and RV33 of an index 2 of the read retry table RTAB.

FIG. 22 is a graph for explaining a case where a read retry operation fails. Referring to FIG. 22, when a first initial read voltage for identifying a first cell distribution E and a second cell distribution P is RVO1 from among an initial read voltage RV0, a read error between the first cell distribution E and the second cell distribution P may still remain when a read retry operation is performed by using the first read level RV11 of the index 0 of the read retry table RTAB and the first read level RV21 of the index 1 of the read retry table RTAB. However, in FIG. 22, a read error which is not corrected by using read levels RVn1, RVn2, and RVn3 of a last index n of the read retry table RTAB still remains. In this case, soft data may be generated.

Figure 23:
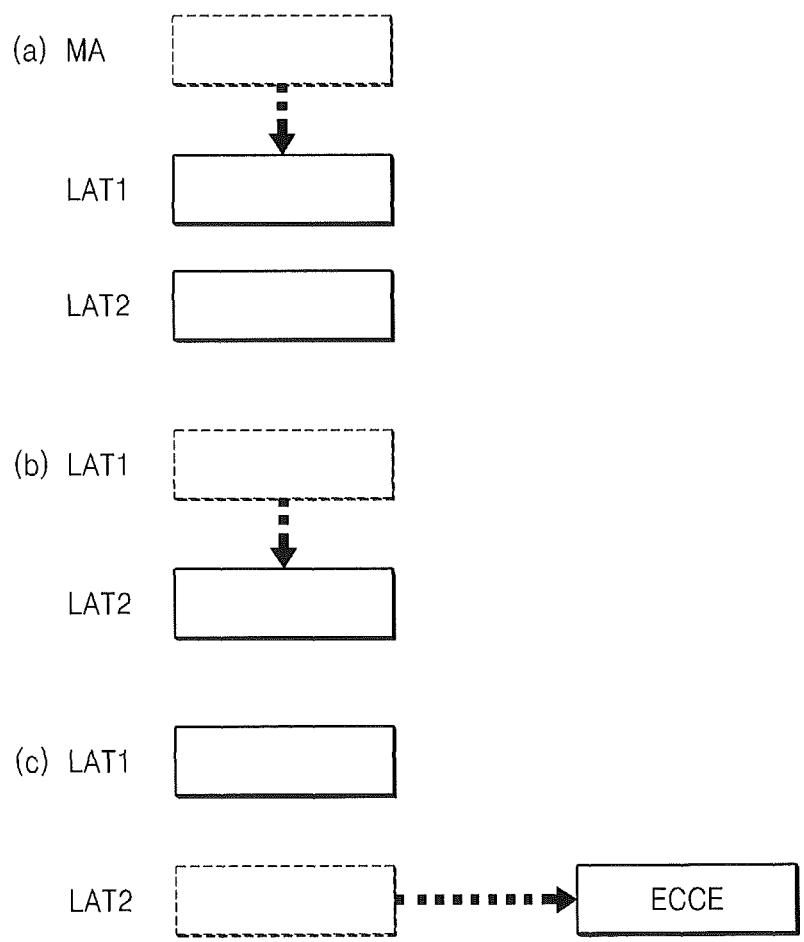

FIGS. 23A through 24 are diagrams for explaining an ECC decoding method according to an embodiment of the inventive concept. During soft decision coding, after the first target page PTGA1 that is read by using read levels included in a first index from among indices of the read retry table RTAB of the first target page PTGA1 is transmitted through the first latch LAT1 to the second latch LAT2 as shown in FIGS. 23A and 23B, while the first target page PTGA1 that is read by using read levels included in a second index from among the indices of the read retry table RTAB of the first target page PTGA1 is transmitted to the first latch LAT1, first ECC decoding may be performed on the second target page PTGA2 transmitted to the second latch LAT2 by using the ECC engine ECCE that may be included in the memory controller Ctrl as shown in FIG. 23C. At the same time as the first ECC decoding is performed, the first target page PTGA1 of the first latch LAT1 may be transmitted to the second latch LAT2 and second ECC decoding may be performed on the second target page TPGA2 transmitted to the second latch LAT2 by using the ECC engine ECCE. The ECC engine ECCE may compare the number of ECC sectors corrected in the first target page PTGA1 due to the first ECC decoding with the number of ECC sectors corrected in the first target page PTGA1 due to the second ECC decoding as shown in FIG. 24. In FIG. 24, two ECC sectors are corrected by using read levels of a first index and 4 ECC sectors are corrected by using read levels of a second index. Also, 5 ECC sectors are corrected by using read levels of a third index, and 2 ECC sectors are corrected by using a fourth index.

Figures 25, 26:
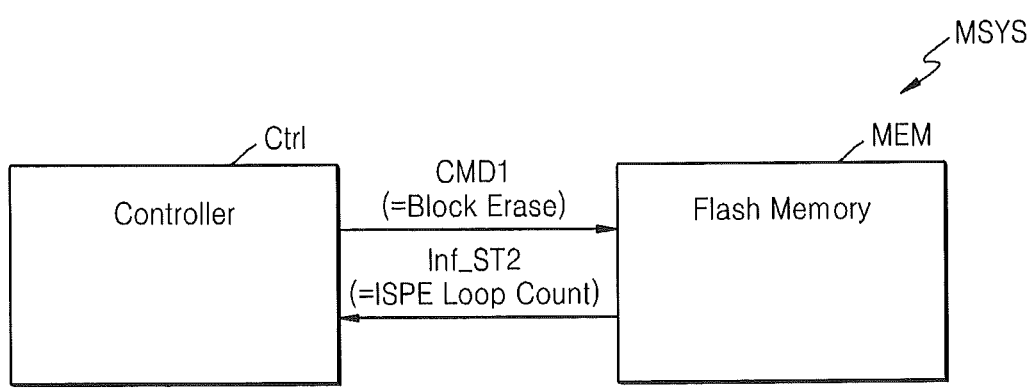
FIG. 25 is a wear-out table according to an embodiment of the inventive concept.
FIG. 26 is a block diagram for explaining a method of updating the wear-out table of FIG. 25.

In FIG. 24, a first read voltage for a hard decision coding may be set to read levels of a third index. In this case, read error correction efficiency may be improved because soft decision coding is performed by using a more accurate hard read voltage. The read retry table RTAB may be selected by referring to a wear-out table WTAB of FIG. 25. Referring to FIG. 25, the wear-out table WTAB includes information WO about the degree of wear-out of each block by using each block of the flash memory MEM as an index. In this case, the information WO about the degree of wear-out of each block may be based on second state information Inf_ST2 detected by the flash memory MEM in response to a first command CMD1 transmitted from the memory controller Ctrl, FIG. 26 is a block diagram for explaining a method of updating the wear-out table WTAB of FIG. 25. Referring to FIG. 26, the first command CMD1 may be an erase command, and the second state information Inf_ST2 may be an incremental step pulse erase (ISPE) loop count value that is used to erase each of blocks of a NAND flash memory.

The wear-out table WTAB of FIG. 25 may further include information Ind about a read level at which a read error is recently corrected by using a read retry operation. Accordingly, when there is a request for a read retry operation on a specific block, the read retry operation may be performed from a read level at which a read error is recently corrected by using a read retry operation. Accordingly, resources and time used to perform a read retry operation may be reduced by greatly reducing the number of times a read retry operation is repeatedly performed.

Also, the read retry table RTAB may be selected from among a plurality of read retry tables of FIG. 27 based on the wear-out information WO of the wear-out table WTAB. That is, the reading method and the memory system may include a read retry table for each endurance state of the flash memory MEM. The endurance state of the flash memory MEM may be indicated by a program/erase (P/E) cycle. For example, a first read retry table RTABA of FIG. 27 may be a read retry table when the P/E cycle is less than 1 K, a second read retry table RTABB may be a read retry table when the P/E cycle is equal to or greater than 1 K and less than 2K, and a third read retry table RTABC may be a read retry table when the P/E cycle is equal to or greater than 2K and less than 3K. However, the present embodiment is not limited thereto, and read retry tables may be set for other numbers of P/E cycles.

Figure 28:
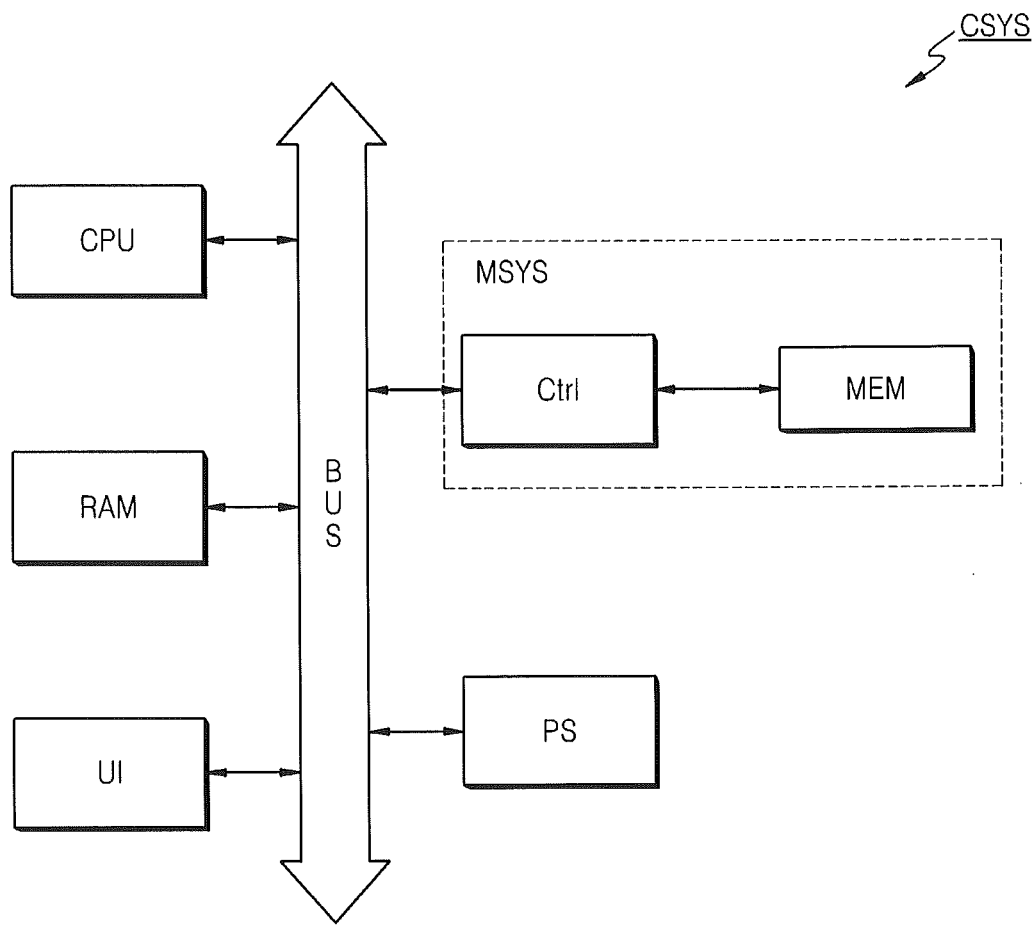
FIG. 28 is a block diagram illustrating a computing system apparatus according to an embodiment of the inventive concept.

FIG. 28 is a block diagram illustrating a computing system apparatus CSYS according to an embodiment of the inventive concept. The computing system CSYS includes a processor CPU, a user interface UI, and a flash memory system MSYS which are electrically connected to a bus BUS. The flash memory system MSYS includes the memory controller Ctrl and the flash memory MEM. N-bit data (N is an integer equal to or greater than 1) processed or to be processed by the processor CPU may be stored by the memory controller Ctrl in the flash memory MEM. The flash memory MEM of FIG. 28 may be the same as the flash memory MEM of FIG. 2. Accordingly, according to the computing system CSYS, since soft decision coding is efficiently performed by using a command that is set in the flash memory MEM even when the flash memory does not support any soft decision coding, resources of the flash memory MEM may be saved and the reliability of a reading operation of the flash memory MEM may be improved.

The computing system CSYS may further include a power supply PS. Also, the computing system CSYS may further include a volatile memory device (for example, a random access memory (RAM)). When the computing system CSYS is a mobile device, a battery for supplying power for the computing system CSYS and a modem such as a baseband chipset may be additionally provided. Also, it will be understood by one of ordinary skill in the art that an application chipset, a camera image processor (CIS), a mobile dynamic random access memory (DRAM), etc. may be further provided to the computing system CSYS, and thus a detailed explanation thereof will not be given.

Figure 29:
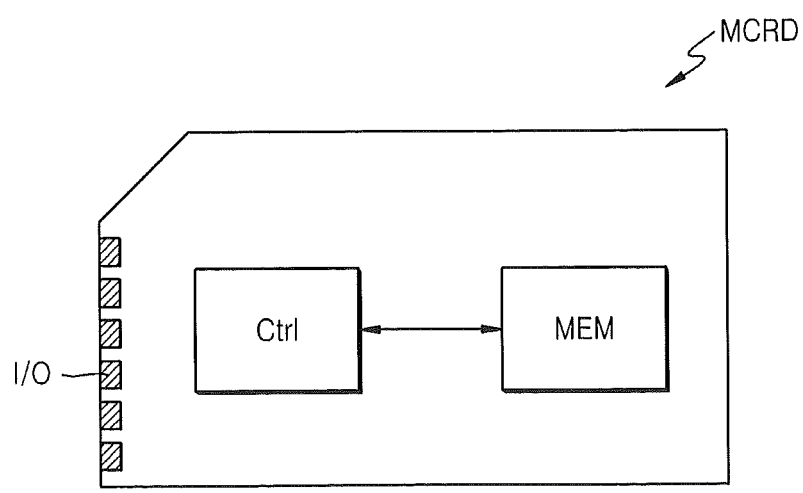
FIG. 29 is a block diagram illustrating a memory card according to an embodiment the inventive concept.

FIG. 29 is a block diagram illustrating a memory card MCRD according to an embodiment of the inventive concept. Referring to FIG. 29, the memory card MCRD includes the memory controller Ctrl and the flash memory MEM. The memory controller Ctrl controls data to be read from the flash memory MEM or written to the flash memory MEM in response to a request of an external host received via an input/output unit (I/O). Also, the memory controller Ctrl controls an erase operation of the flash memory MEM. The memory controller Ctrl of the memory card MCRD may include a RAM and interface units (not shown) for interfacing with a host and a memory device in order to perform the above control operations. The flash memory MEM of the memory card MCRD may be the same as the flash memory MEM of FIG. 2.

Examples of the memory card MCRD of FIG. 29 may include a compact flash card (CFC), a microdrive, a smart media card (SMC), a multimedia card (MMC), a security digital card (SDC), a memory stick, and a universal serial bus (USB) flash memory driver. Accordingly, according to the memory card MCRD of FIG. 29, since soft decision coding is efficiently performed even in a NAND flash memory that does not support any soft decision coding, resources of the flash memory MEM may be saved and the reliability of a reading operation of the flash memory MEM may be improved.

Figure 30:
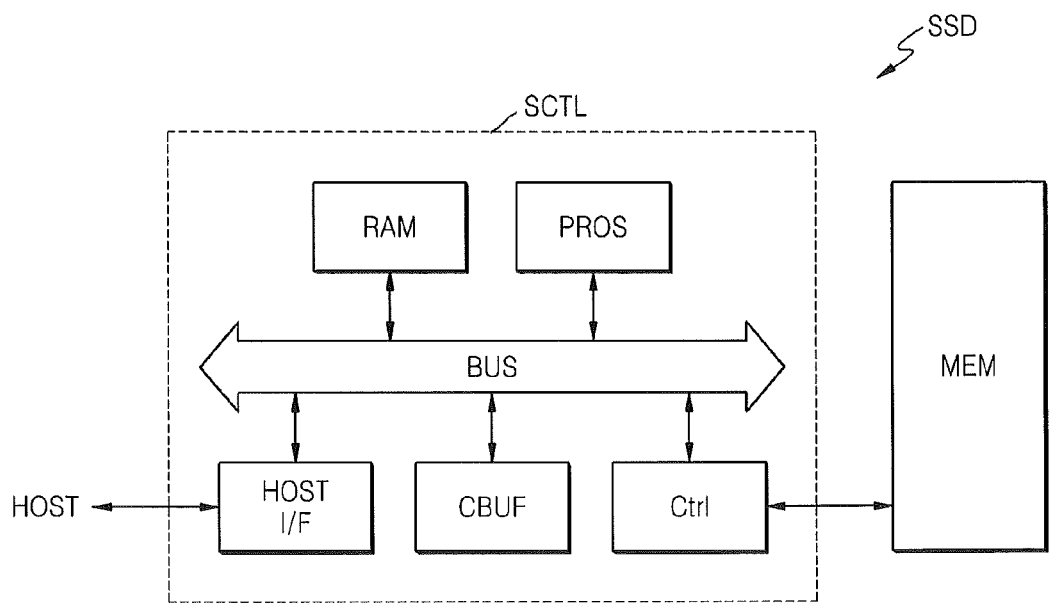
FIG. 30 is a block diagram illustrating a solid-state drive (SSD) according to an embodiment of the inventive concept.

FIG. 30 is a block diagram illustrating a solid-state drive (SDD) according to an embodiment of the inventive concept. Referring to FIG. 30, the SSD includes an SSD controller SCTL and the flash memory MEM. The SSD controller SCTL may include a processor PROS, a RAM, a cache buffer CBUF, and the memory controller Ctrl which are connected to a bus BUS. The processor PROS controls the memory controller Ctrl to transmit and receive data with the flash memory MEM in response to a request (e.g., a command, an address, or data) of a host (not shown). The processor PROS and the memory controller Ctrl of the SSD may be configured as one ARM processor. Data needed to operate the processor PROS may be loaded into the RAM. For example, the read retry table RTAB of FIG. 2 may be loaded into the RAM.

A host interface HOST I/F receives the request of the host and transmits the request to the processor PROS, or transmits data transmitted from the flash memory MEM to the host. The host interface HOST I/F may interface with the host by using any of various interface protocols such as USB, man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). Data to be transmitted to the flash memory MEM or transmitted from the flash memory MEM may be temporarily stored in the cache buffer CBUF. The cache buffer CBUF may be a static random access memory (SRAM). The flash memory MEM of the SSD may be the same as the flash memory MEM of FIG. 2. Accordingly, according to the SSD of FIG. 30, the reliability of a reading operation may be improved and resources required for a system may be reduced.

Figure 31:
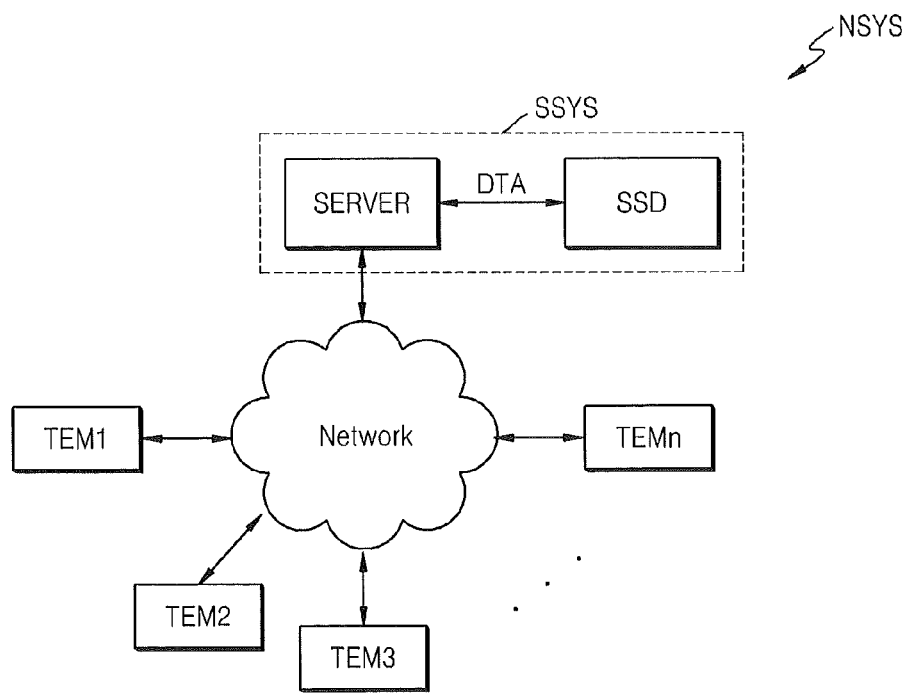
FIG. 31 is a block diagram illustrating a network system including a server system including an SSD, according to an embodiment of the inventive concept.

FIG. 31 is a block diagram illustrating a network system NSYS including a server system SSYS including an SSD, according to an embodiment of the inventive concept. Referring to FIG. 31, the network system NSYS may include the server system SSYS and a plurality of terminals TEM1 through TEMn which are connected to one another via a network. The server system SSYS may include a server SERVER that processes requests received from the plurality of terminals TEM1 through TEMn connected to the network, and the SSD that stores data corresponding to the requests received from the terminals TEM1 through TEMn. In this case, the SSD of FIG. 31 may be the same as the SSD of FIG. 30. That is, the SSD of FIG. 31 may include the SSD controller SCTL and the flash memory MEM, and the flash memory MEM may be a flash memory that performs a reading operation by using the reading method of FIG. 1.

Figure 32:
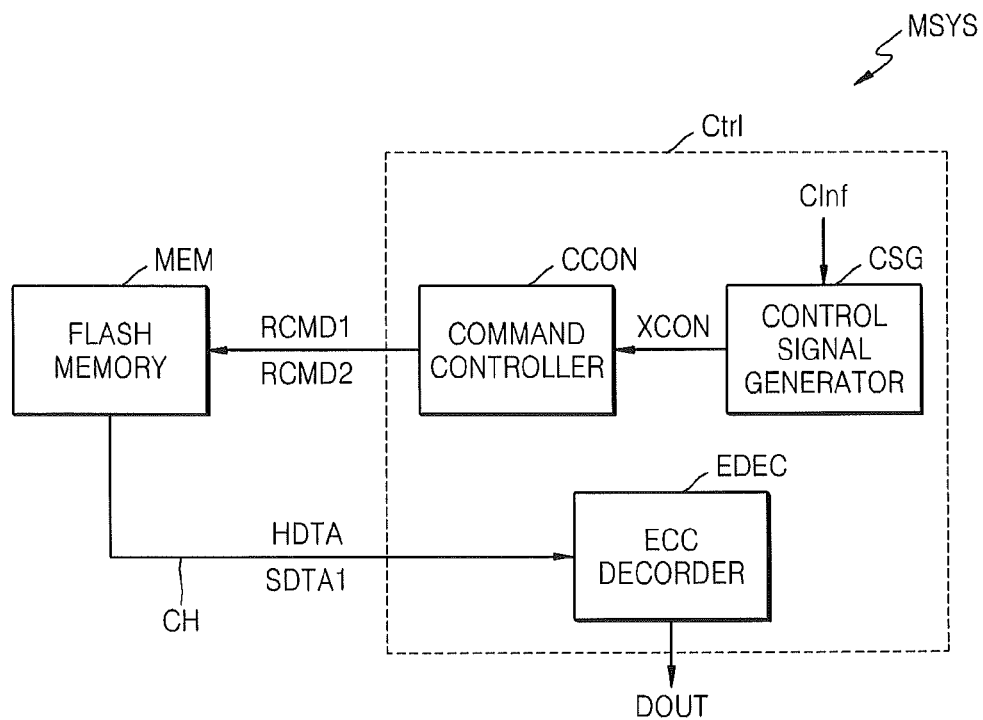
FIG. 32 is a block diagram illustrating a flash memory system according to an embodiment of the inventive concept.
Figure 33:
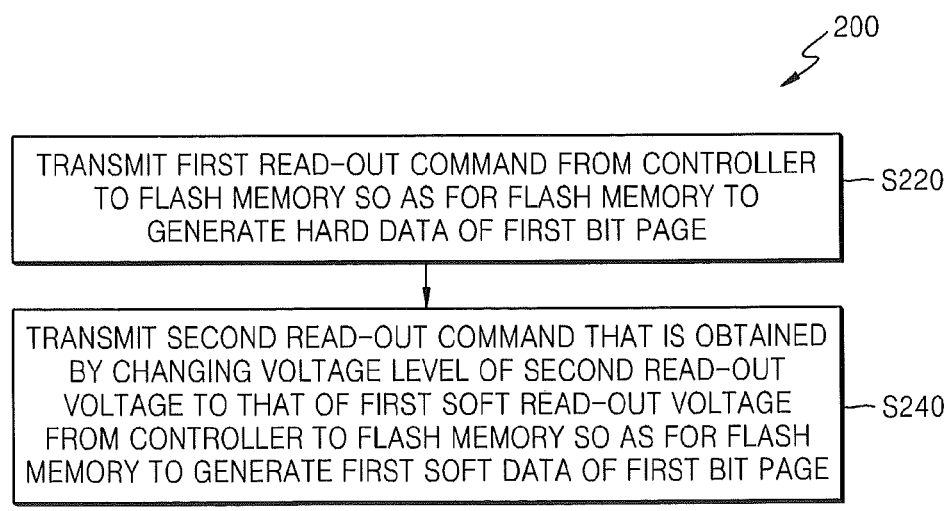
FIG. 33 is a flowchart illustrating a read-out method of the flash memory system of FIG. 32.

FIG. 32 is a block diagram illustrating a flash memory system MSYS according to an embodiment of the inventive concept. FIG. 33 is a flowchart illustrating a read-out method 200 of the flash memory system MSYS. Referring to FIGS. 32 and 33, the flash memory system MSYS includes the flash memory MEM and the memory controller Ctrl. The read-out method 200 includes operation S220 in which a first read-out command RCMD1 is transmitted from the memory controller Ctrl to the flash memory MEM so as for the flash memory MEM to generate hard data HDTA of a first bit page, and operation S240 in which a second read-out command RCMD2 is transmitted by using a first soft read-out voltage that is obtained by changing a voltage level of a second read-out voltage from the memory controller Ctrl to the flash memory MEM so as for the flash memory MEM to generate first soft data SDTA1 of the first bit page.

Referring back to FIG. 32, the flash memory MEM receives the first read-out command RCMD1. The first read-out command RCMD1 includes information about a first read-out voltage of the first bit page and an address of the first bit page as a command for determining a bit value of a first bit of program data. The first read-out voltage described below may be any of a first read-out voltage used to read out the first bit of the program data during a program operation, and a first read-out voltage used to read out the first bit of the program data upon completion of the program operation. In this case, the first bit of the program data may be an LSB. When the first read-out voltages need to be distinguished from each other, the first read-out voltage applied to the first bit page in order to read out the first bit during a program operation may be denoted by VIR1, and the first read-out voltage applied to the first bit page in order to read out the first bit upon completion of the program operation may be denoted by VR1.

Figure 34:
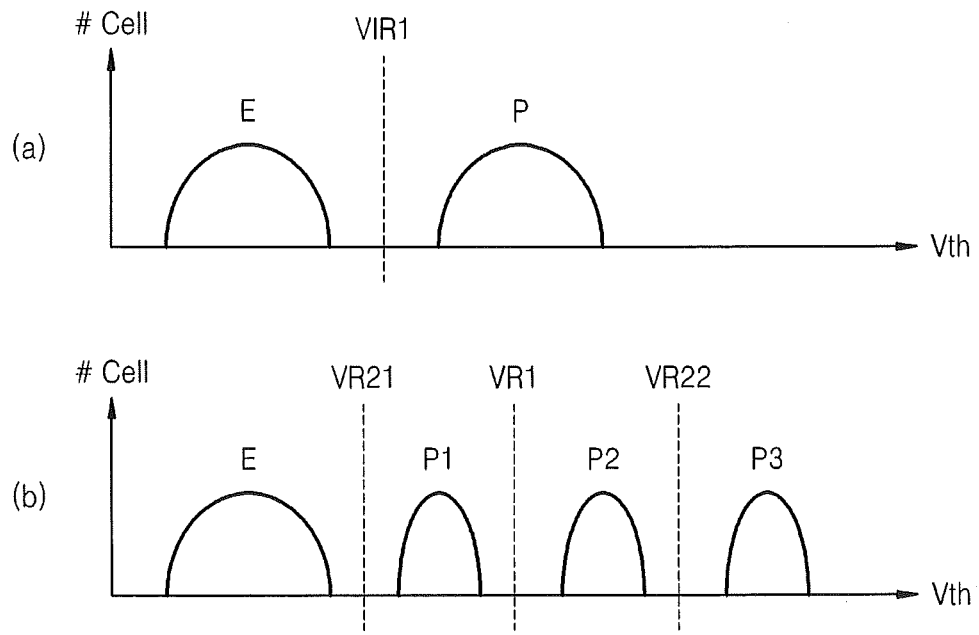
FIGS. 34A and 34B are graphs illustrating an LSB page and an MSB page in a 2-bit MLC.

In this case, read-out performed during a program operation refers to read-out performed in a bit page that is programmed to store a bit before an MSB during a program operation in multi-bits. For example, in a 2-bit MLC flash memory, read-out performed during a program operation will be explained. In the 2-bit MLC flash memory, the first bit of the program data may be an LSB. Each memory cell of the first bit page during a program operation may have a threshold voltage having one of states of FIG. 34A showing a program state of the LSB (first bit). That is, as shown in FIG. 34A, memory cells of the first page may be erased or programmed in one of an erase state E and a program state P. Read-out, which is performed in order to determine whether the first bit of the program data is "1" or "0" by using the first read-out voltage VIR1 having a voltage level between the erase state E and the program state P of FIG. 34A, is performed on the first page during a program operation. Meanwhile, read-out, which is performed upon completion of a program operation, is performed after a last bit, that is, an MSB, from among multi-bits is programmed. For example, in a 2-bit MLC flash memory, the first bit of the program data may be an LSB and a second bit (last bit) may be an MSB of the program data. In this case, each of memory cells in which the second bit (last bit) is completely programmed may have any of states of FIG. 34B. That is, each of the memory cells may have a threshold voltage having one of an erase state E, a first program state P1, a second program state P2, and a third program state P3.

In FIG. 34B, the first bit of the program data is read out by using the first read-out voltage VR1 having a voltage level between the first program state P1 and the second program state P2. Due to the first read-out voltage VR1, the first bit of the program data programmed in memory cells having threshold voltages belonging to the erase state E and the first program state P1 of FIG. 34B may be determined to be "1", and the first bit of the program data programmed in memory cells having threshold voltages belonging to the second program state P2 and the third program state P3 may be determined to be "0". That is, read-out may be performed on the first page after completion of a program operation due to the first read-out voltage VR1. A read-out method performed on the first bit page due to the first read-out voltage VIR1 during a program operation will now be explained. Referring back to FIG. 3B, as flash memories are scaled down and have higher integration, a distance between the memory cells MCEL of FIG. 3B decreases. Accordingly, coupling occurs between adjacent memory cells MCEL in the same string, or between adjacent memory cells MCEL in the same page. Furthermore, as the performance of a flash memory system is degraded, a cell distribution of an LSB page of FIG. 34A may be changed as shown in FIG. 6A. In this case, during a program operation, a read-out margin for distinguishing the erase state E and the program state P by using the first read-out voltage VIR1 may be reduced. Once the read-out margin is reduced, in read-out performed during a program operation, an LSB value of a memory cell having a threshold value in an area where the erase state E and the program state P are adjacent to each other may be incorrectly read out.

Accordingly, in read-out performed during a program operation, a bit value of a first bit programmed in a first bit page may not be determined as a bit value read out by using the first read-out voltage VIR1. An operation of determining a first bit value by correcting an error that may be included in first bit values output from the flash memory MEM in response to a first read-out command for a first bit page will be explained. Data output from the flash memory MEM in response to the first read-out command for the first bit page is referred to as hard data of the first bit page.

Referring back to FIG. 32, the flash memory MEM outputs the hard data HDTA of the first bit page in response to the first read-out command RCMD 1. The first read-out command RCMD1 is transmitted from the memory controller Ctrl. The memory controller Ctrl includes a command controller CCON that transmits a command such as the first read-out command RCMD1 to the flash memory MEM in order to read out program data from the flash memory MEM. The memory controller Ctrl includes the command controller CCON, a control signal generator CSG, and an error correction decoder EDEC. The control signal generator CSG generates control signal XCON corresponding to channel information CInf of a channel CH connected to the flash memory MEM. The control signal XCON is transmitted to the command controller CCON and is used to control read-out of the flash memory MEM. The error correction decoder EDEC performs error correction decoding on a bit value of the first bit of each program data. The control signal generator CSG and the error correction decoder EDEC will be explained in detail below.

Still referring to FIG. 32, the command controller CCON transmits the first read-out command RCMD1 to the flash memory MEM in order to read out the hard data HDTA of the first bit page, and transmits a second read-out command RCMD2 that is obtained by changing a voltage level of a second read-out voltage to the flash memory MEM in order to read out the first soft data SDTA1 of the first bit page. However, the present embodiment is not limited thereto. According to the flash memory system MSYS and the read-out method, the first soft data SDTA1 is first read out by using the second read-out command RCMD2, and then the hard data HDTA may be read-out by using the first read-out command RCMD1.

The second read-out command RCMD2 is a command for reading out a second bit of the program data. Referring to FIG. 34B, in a 2-bit MLC flash memory, the flash memory MEM determines that an MSB value of a memory cell is "1" or "0" according to a threshold voltage of the memory cell by using second read-out voltages VR21 and VR22. The second read-out voltage VR21 may have a voltage level between the erase state E and the first program state P1. The second read-out voltage VR22 may have a voltage level between the second program state P2 and the third program state P3.

The command controller CCON transmits the second read-out command RCMD2 used to read out a second bit page to the flash memory MEM in order to generate the first soft data SDTA1 of the first bit page by changing voltage levels of the second read-out voltages VR21 and VR22. A method of generating hard data and first soft data of the first bit page in the flash memory system MSYS including a 2-bit MLC flash memory will be explained in detail below.

Figure 35:
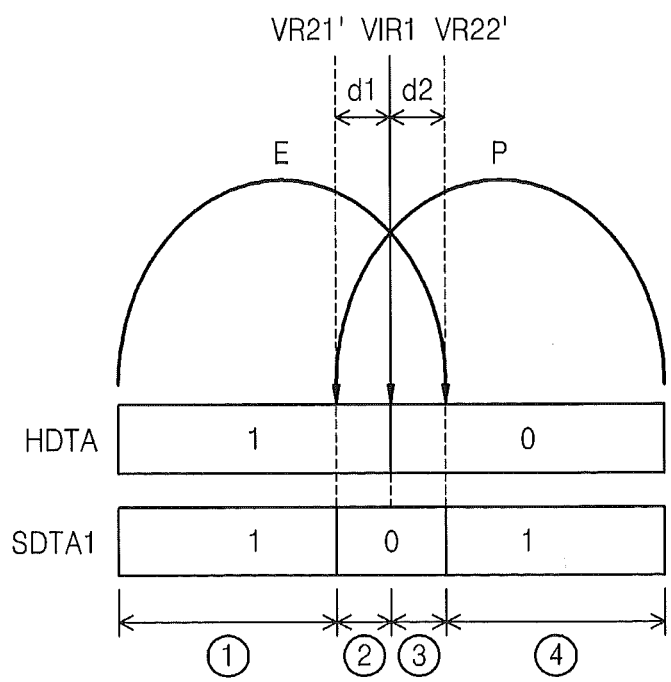
FIG. 35 is a graph for explaining a method of generating first soft data and hard data of an LSB page by using a read-out method during a program operation in a 2-bit MLC flash memory.

FIG. 35 is a graph for explaining a method of generating hard data and first soft data of an LSB page by using a read-out method during a program operation in a 2-bit MLC flash memory. Referring to FIGS. 32 and 35, the flash memory system MSYS generates LSB hard data by reading out an LSB page during a program operation by using an LSB read-out command. The LSB page is the first bit page, and the LSB read-out command is the first read-out command RCMD1. Also, the LSB hard data is the hard data HDTA of the first bit page. For consistency in the use of terms, an LSB page, an LSB read-out command, and LSB hard data are referred to as a first bit page, a first read-out command, and hard data of the first bit page, respectively.

The flash memory MEM may generate the hard data HDTA of the first bit page in response to a first read-out command. A bit value of a first bit of each memory cell of the first bit page during a program operation is sensed as "1" or "0" by using the first read-out voltage VIR1. Accordingly, the hard data HDTA of the first bit page is generated by combining "1" with "0".

The flash memory system MSYS generates LSB soft data by reading out the first bit page by using an MSB read-out command that is obtained by changing a voltage level of the MSB read-out voltage. The MSB page may be a 2-bit page, and the MSB read-out command may be the second read-out command RCMD2. Also, the LSB soft data may be the first soft data SDTA1 of the first bit page during a program operation, and the MSB read-out voltage of the MSB read-out command may be the second read-out voltages VR21 and VR22 of FIG. 34B. For consistency in the use of terms, an MLSB page, an MSB read-out command, an MSB read-out voltage, and LSB soft data are referred to as a second bit page, a second read-out command, a second read-out voltage, and first soft data of the first bit page, respectively.

As described above, the second read-out voltage VR21 for reading out the MSB page may have a voltage level between the erase state E and the first program state P1. The second read-out voltage VR22 may have a voltage level between the second program state P2 and the third program state P3.

However, a first soft read-out voltage of the second read-out command used to generate the first soft data SDTA1 of the first bit page during a program operation of the flash memory system MSYS is different from a second read-out voltage of the second read-out command RCMD2 for reading out the second bit page. The command controller CCON generates the first soft data SDTA1 of the first bit page during a program operation by using second soft read-out voltages VR21' and VR22' that are obtained by changing voltage levels as shown in FIG. 34B to voltage levels close to a voltage level of the first read-out voltage VIR1 as shown in FIG. 35.

A voltage difference d1 between the first read-out voltage VIR1 and the first soft read-out voltage VR21' may be the same as or different from a voltage difference d2 between the first read-out voltage VIR1 and the first soft read-out voltage VR22'. That is, the number of the first soft read-out voltages VR21' and VR22' may be a multiple of the number of the first read-out voltages VIR1. Voltage levels of 2n (n is a natural number) first soft read-out voltages VR21' and VR22' may be changed to be symmetric or asymmetric with respect to the first read-out voltages VIR1. The voltage differences d1 and d2 between the first read-out voltages VIR1 and the first soft read-out voltages VR21' and VR22' and whether the voltage differences d1 and d2 are the same may be set to correspond to the channel information CInf included in the control signal XCON, which will be explained in detail below.

A threshold voltage of each memory cell of the first bit page during a program operation may be sensed as "1" or "0" by using the first soft read-out voltages VR21' and VR22' as shown in FIG. 35. Accordingly, the first soft data SDTA1 of the first page during a program operation is generated to correspond to "11", "10", "00", and "01" for threshold voltages of sections (1) through (4) of FIG. 35.

Figure 36:
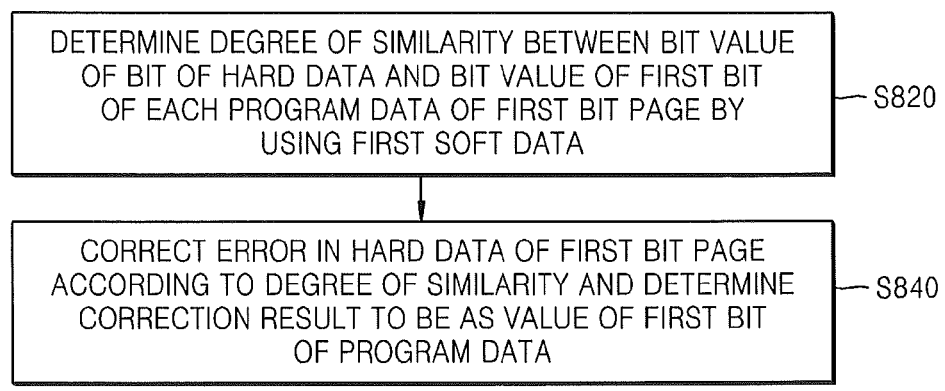
FIG. 36 is a flowchart illustrating a method of determining read-out data of a first bit page based on first soft data and hard data, according to an embodiment of the inventive concept.

FIG. 36 is a flowchart illustrating a method of determining read-out data of a first bit page based on hard data and first soft data, according to an embodiment of the inventive concept. Referring to FIGS. 32 and 36, the method includes operation S820 in which the error correction decoder EDEC of FIG. 32 determines the degree of similarity between a bit value of a bit of the hard data HDTA and a bit value of the first bit of each program data of the first bit page during a program operation by using the first soft data SDTA1, and in operation S840 in which an error in the hard data HDTA of the first bit page is corrected and a correction result is determined to be a value of the first bit of the program data.

A read-out method of a first bit page during a program operation of the flash memory system MSYS has been described. The flash memory system MSYS may generate hard data and first soft data for a first bit page during a program operation, correct an error in the hard data of the first bit page during the program operation based on the hard data and the first soft data, and perform read-out on the first bit page during the program operation. However, the same applies to a 2-bit MLC flash memory system.

That is, in a three or more-bit MLC flash memory system, there may exist a second bit page during a program operation. In this case, an operation of correcting an error in hard data of a second bit page during a program operation, that is, soft decision coding, may be performed on the second bit page during the program operation. However, for convenience, an explanation of soft decision coding for the second bit page or more in read-out during a program operation will not be given.

The flash memory system MSYS may not perform soft decision coding on a bit page after completion of a program operation. That is, as described above, the flash memory system MSYS may perform soft decision coding only on a bit page during a program operation. For example, in a 2-bit MLC flash memory, a first bit value may be determined by using the first read-out voltage VR1 and a second bit value may be determined by using the second read-out voltages VR21 and VR22 as shown in FIG. 34B.

However, the flash memory system MSYS may perform soft decision coding on a bit page after completion of a program operation, separately or along with soft decision coding performed on a bit page during a program operation. In this case, soft decision coding may be performed on a part of a bit page after completion of a program operation. For example, in a 2-bit MLC flash memory system, soft decision coding may be performed on a first bit page, and may not be performed on a second bit page.

Figure 37:
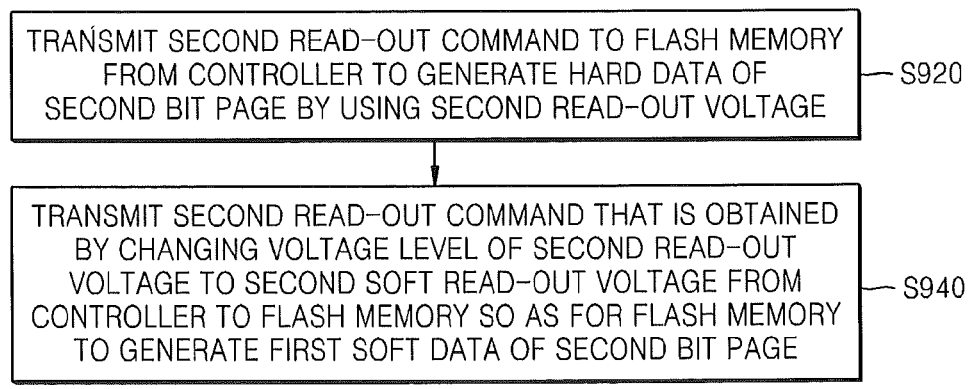
FIG. 37 is a flowchart illustrating a read-out method for a bit page after completion of a program operation, according to an embodiment of the inventive concept.

Various read-out methods for a bit page after completion of a program operation will be explained. FIG. 37 is a flowchart illustrating a read-out method for a bit page after completion of a program operation, according to an embodiment of the inventive concept. Soft decision coding for a first bit page after completion of a program operation has been described with reference to FIG. 33. A detailed operation is the same as that for a first bit page during a program operation described with reference to FIGS. 35 and 36 except that hard data of the first bit page is read out by using the first read-out voltage VR1 of FIG. 34B, and thus soft decision coding for the first bit page after completion of a program operation will not be explained in FIG. 37 and soft decision coding for a second bit page after completion of a program operation will be explained.

Referring to FIGS. 32 and 37, in operation S920, the command controller CCON of the memory controller Ctrl transmits the second read-out command RCMD2 to the flash memory MEM so as for the flash memory MEM to generate the hard data HDTA of the second bit page by using a second read-out voltage. The second read-out command RCMD2 is a command for determining a bit value of a second bit of program data and includes information about a second read-out voltage that is a read-out voltage for the second bit page and an address of the second bit page as described above. Also, as described above, in a 2-bit MLC flash memory, the second bit of the program data may be an MSB of the program data and the second bit page may be an MSB page.

Referring to FIG. 34B, the flash memory MEM may sense the erase state E as "1" that is an MSB value, and the first program state P1 through the third program state P3 as "0" that is an MSB value by using the second read-out voltage VR21. The flash memory MEM may sense the erase state E, the first program state P1, and the second program state P2 as "1" that is an MSB value, and the first program state P1 through the third program state P3 as "0" that is an MSB value by using the second read-out voltage VR22. The MSB values of the MSB page are output as the hard data HDTA of the MSB page.

However, as flash memory systems have higher integration and the performance of the flash memory systems are degraded, a cell distribution of the MSB page of FIG. 34B may be changed, thereby reducing a read-out margin for distinguishing the MSB values by using the second read-out voltages VR21 and VR22. Once the read-out margin is reduced, an MSB value of a memory cell having a threshold value in an area where the erase state E and the first program state P1 are adjacent to each other or an area where the second program state P2 and the third program state P3 are adjacent to each other may be incorrectly read out.

An operation of determining a second bit value by correcting an error that may be included in second bit values output from the flash memory MEM by using a second read-out command for a second bit page in the flash memory system MSYS will now be explained. In particular, a method of generating hard data and first soft data of a second bit page in the flash memory system MSYS including a 2-bit MLC flash memory will be explained in detail. Also, data output for a second bit page in response to a second read-out command that is obtained by not changing a voltage level is referred to as hard data, and data output for the second bit page in response to a second read-out command that is obtained by changing a voltage level is referred to as first soft data.

Figure 38A:
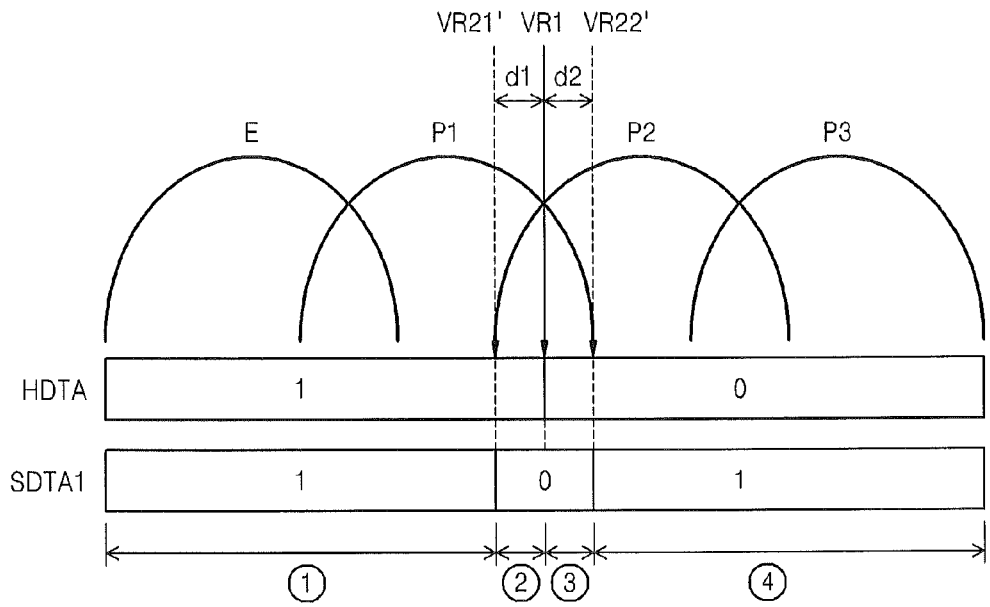
FIGS. 38A, 38B, and 39 are diagrams for explaining a method of generating first soft data and hard data of an LSB page and an MSB page in a read-out method after completion of a program operation in a 2-bit MLC flash memory.
Figure 38B:
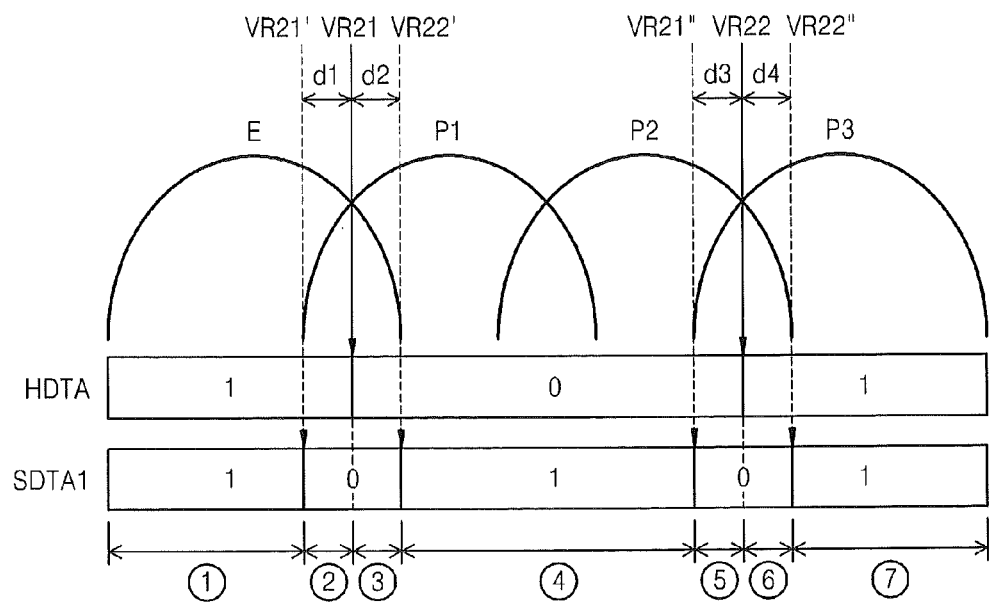

FIG. 38A is a graph for explaining a method of generating hard data and first soft data of an LSB page in a read-out method after completion of a program operation in a 2-bit MLC flash memory, according to an embodiment of the inventive concept. FIG. 38B is a graph for explaining a method of generating hard data and first soft data of an MSB page in a read-out method after completion of a program operation in a 2-bit MLC flash memory, according to another embodiment of the inventive concept.

Referring to FIGS. 32 and 38A, the flash memory system MSYS may perform read-out for an LSB page after completion of a program operation by using the first read-out voltage VR1 having a voltage level between the first program state P1 and the second program state P2 of FIG. 34B. As described above, a read-out operation for the first page (LSB page) after completion of a program operation is the same as that during a program operation of FIG. 35 except for a voltage level of a read-out voltage, and thus a detailed explanation thereof will not be given. Referring to FIGS. 32 and 38B, the flash memory system MSYS generates MSB hard data by reading out a second bit page of program data that is an MSB page after completion of a program operation by using the second read-out command RCMD2 that is an MSB read-out command. The MSB hard data is the hard data HDTA of the second bit page. For consistency in the use of terms, the MSB hard data is referred to as hard data of a second bit page.

The flash memory MEM may generate the hard data HDTA of the second bit page in response to the second read-out command RCMD2. A bit value of each memory cell of the first bit page, that is, a bit value of a second bit of program data, is sensed as "1" or "0" by using the second read-out voltages VR21 and VR22. In FIG. 38B, a bit value of a cell having a threshold value lower than the second read-out voltage VR21 is sensed as "1", a bit value of a cell having a threshold value between the second read-out voltages VR21 and VR22 is sensed as "0", and a bit value of a cell having a threshold value higher than the second read-out voltage VR22 is sensed as "1". Once the hard data HDTA is generated by using the bit values, the flash memory MEM transmits the hard data HDTA of the second bit page to the memory controller Ctrl.

The flash memory system MSYS generates MSB soft data of the second bit page, that is, the first soft data SDTA1 of the second bit page, by changing voltage levels of the second read-out voltages VR21 and VR22. The second read-out voltage VR21 for reading out the MSB page may have a voltage level between the erase state E and the first program state P1 as shown in FIG. 34B. The second read-out voltage VR22 may have a voltage level between the second program state P2 and the third program state P3.

Second soft read-out voltages VR21', VR22', VR21", and VR22' of the second read-out command RCMD2 used to generate the first soft data SDTA1 of the second bit page in the flash memory system MSYS are different from the second read-out voltages VR21 and VR22 of the second read-out command RCMD2 for generating the hard data HDTA of the second bit page. The command controller CCON generates the first soft data SDTA1 of the second bit page by using the second soft read-out voltages VR21', VR22', VR21", and VR22' that are obtained by changing voltage levels of the second read-out voltages VR21 and VR22 of FIG. 38B used to generate the hard data HDTA of the second bit page.

A voltage difference d1 between the second read-out voltage VR21 and the second soft read-out voltage VR21' and a voltage difference d2 between the second read-out voltage VR21 and the second soft read-out voltage VR22' may be the same as or different from each other. Likewise, a voltage difference d3 between the second read-out voltage VR22 and the second soft read-out voltage VR21" and a voltage difference d4 between the second read-out voltage VR22 and the second soft read-out voltage VR22" may be the same as or different from each other. Furthermore, the voltage differences d1 and d2 between the second read-out voltage VR21 and the second soft read-out voltages VR21' and VR22' and the voltage differences d3 and d4 between the second read-out voltage VR22 and the second soft read-out voltages VR21" and VR22" may be the same as or different from each other.

A threshold voltage of each memory cell of the second bit page is sensed as "1" or "0" by using the second soft read-out voltages VR21', VR22', VR21", and VR22". Accordingly, the first soft data SDTA1 of the first bit page is generated to correspond to "11", "10", "00", "01", "00", "10", and "11" for threshold voltages of sections (1) through (7) of FIG. 38B.

A method of determining a bit value of each memory cell of the second bit page by using the first soft data SDTA1 of the second bit page is the same as that for the first bit page, and thus a detailed explanation thereof will not be given.

In FIG. 38B, in order to generate the first soft data SDTA1 of the second bit page, read-out is performed by using the second soft read-out voltages VR21', VR22', VR21", and VR22" in all adjacent states distinguished by the second read-out voltages VR21 and VR22 from among i (i is $2^j-1$, and j is a natural number) program states and the erase state of the second bit page. In detail, in FIG. 38B, in order to generate the first soft data SDTA1 of the second bit page, a threshold voltage of a memory cell is re-read out by using the second soft read-out voltages VR21' and VR22' in the erase state E and the first program state P1 that are adjacent to each other and are distinguished by the second read-out voltage VR21, and a threshold voltage of a memory cell is re-read out by using the second soft read-out voltages VR21" and VR22" in the second program state P2 and the third program state P3 that are adjacent to each other and are distinguished by the second read-out voltage VR22.

Figure 39:
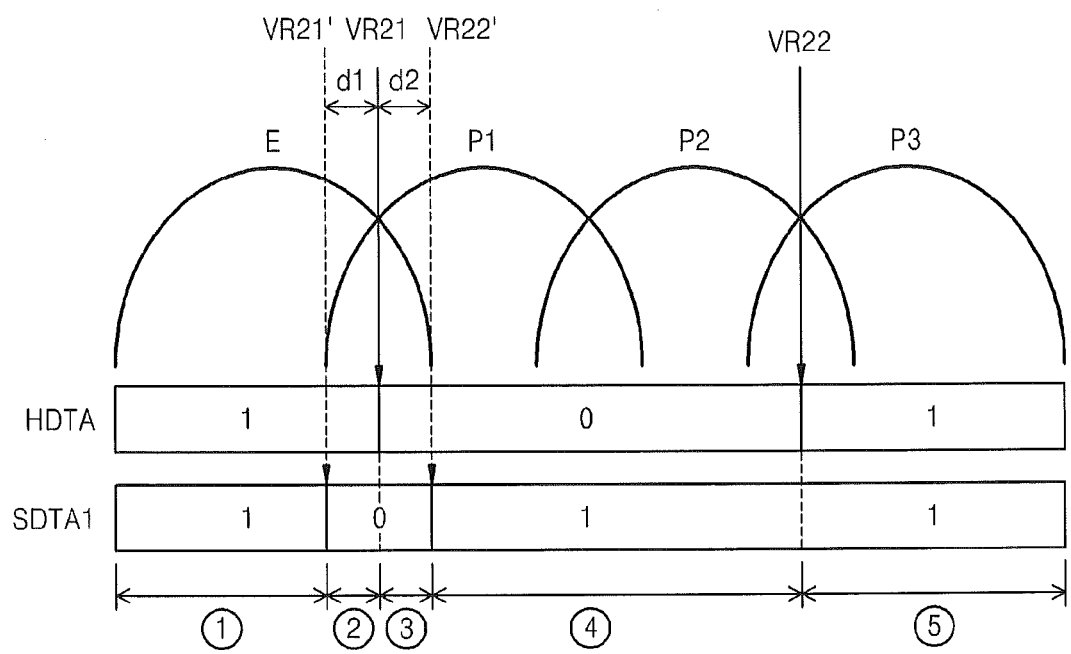

However, the present embodiment is not limited thereto. As shown in FIG. 39, while the first soft data SDTA1 is generated by using the second soft read-out voltages VR21' and VR22' in the erase state E and the first program state P1 that are adjacent to each other and are distinguished by the second read-out voltage VR21, a second soft read-out voltage may not be applied in the second program state P2 and the third program state P3 that are adjacent to each other and are distinguished by the second read-out voltage VR22. Accordingly, according to the flash memory system MSYS, since first soft data is generated variously according to a program state, read-out optimized for performance degradation of the flash memory MEM may be performed.

Also, although read-out for a second bit page after completion of a program operation has been explained in relation to FIG. 38B, the same may apply to read-out for a second bit page during a program operation in a three or more-bit MLC flash memory system. However, as described above, a voltage level of a second read-out voltage during a program operation and a voltage level of a second read-out voltage after completion of a program operation of FIG. 38B may be different from each other.

Although a flash memory system including a 2-bit MLC flash memory and a read-out method of the flash memory system have been described, the present embodiment is not limited thereto. A read-out method of a flash memory system including a 3-bit MLC flash memory will now be explained.

Figure 40:
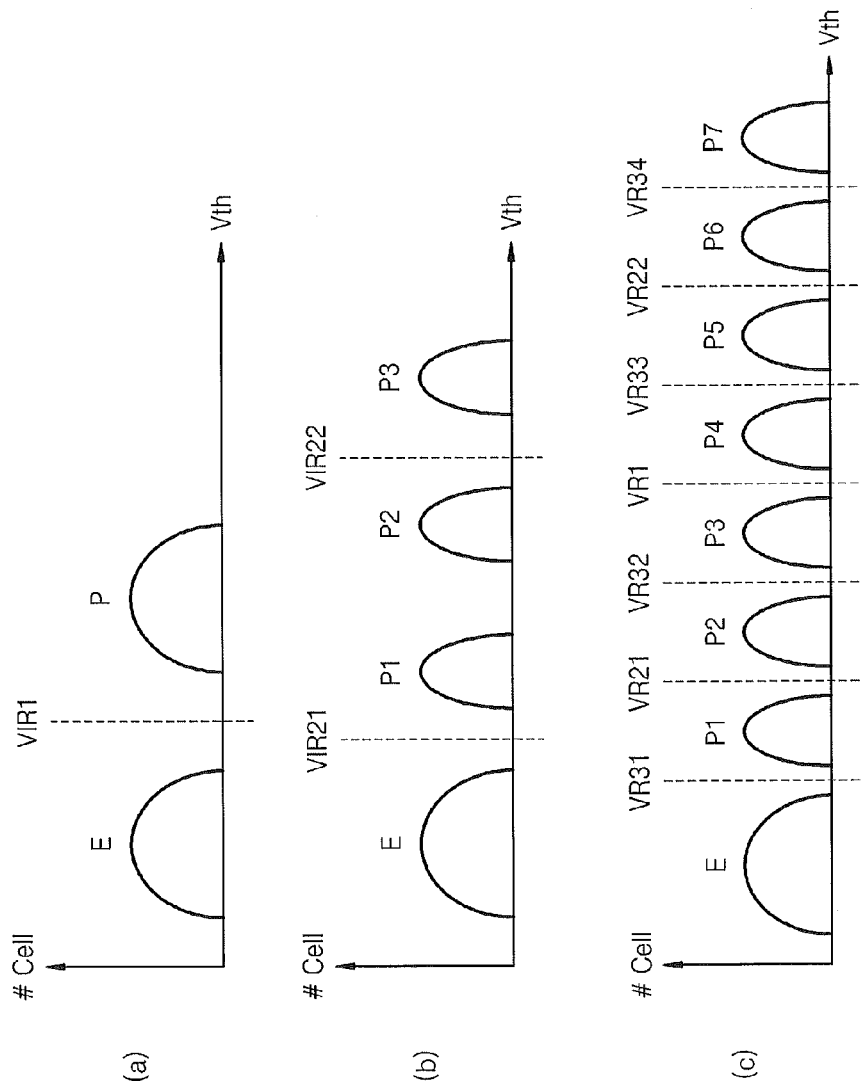
FIGS. 40A through 40C are graphs for explaining a program operation of a flash memory system including a 3-bit MLC flash memory.
Figure 41:
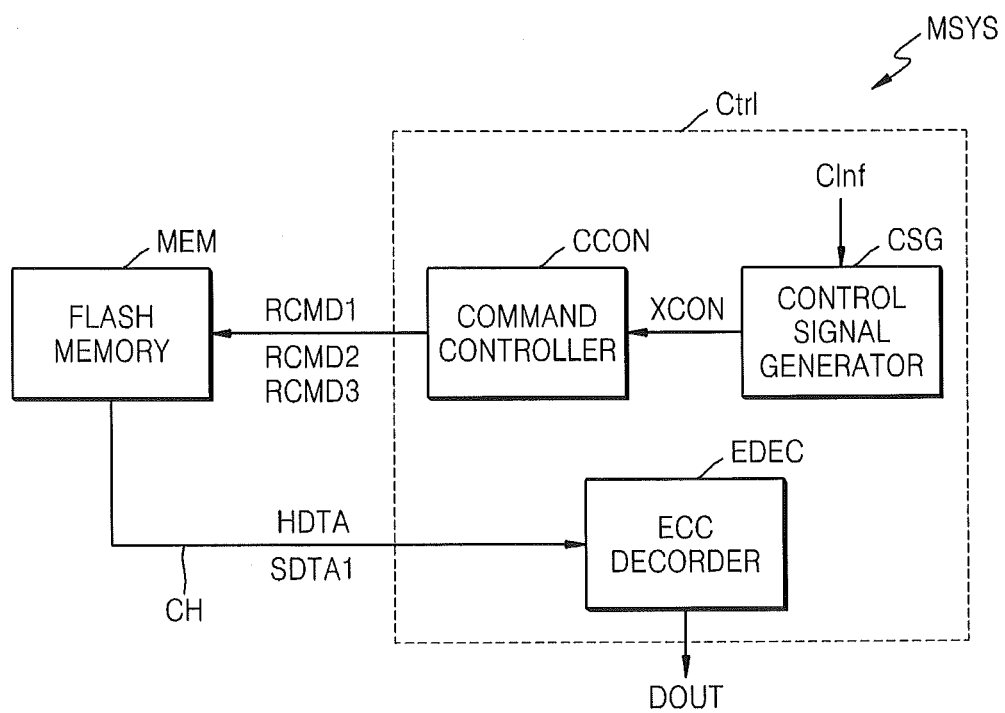
FIG. 41 is a block diagram for explaining an LSB page, a central significant bit (CSB) page, and an MSB page of a flash memory.

FIGS. 40A through 40C are graphs for explaining a program operation in a 3-bit MLC flash memory. FIG. 41 is a block diagram illustrating a 3-bit MLC flash memory system. In the 3-bit MLC flash memory system, a first bit of program data is programmed to one of the erase state E and the program state P of FIG. 40A. In this case, during a program operation, the first bit is read out by using the first read-out voltage VIR1. The first read-out voltage VIR1 of FIG. 40A may be the same as the first read-out voltage VIR1 of FIG. 34A. The program data is programmed from the state of FIG. 40A to one of the erase state E and the first through third program states P1 through P3. In this case, during a program operation, a second bit of the program data is read out by second read-out voltages VIR21 and VIR22 of FIG. 40B. A first read-out voltage during a program operation is denoted by VIR1 to be distinguished from the first read-out voltage VR1 after a program operation of FIG. 38A. Likewise, in order to indicate that read-out of FIG. 40A is performed during a program operation, second read-out voltages are denoted by VIR21 and VIR22 in FIG. 40A to be distinguished from the second read-out voltages VR21 and VR22 of FIG. 38B.

The program data is programmed from the state of FIG. 40A to the state of FIG. 40C, and thus a program operation performed on the program data in the 3-bit MLC flash memory system is completed. Each memory cell of the 3-bit MLC flash memory system may belong to one of the erase state E and the first program state P1 through the seventh program state P7 of FIG. 40C. In this case, the first bit of the program data may be determined by using the first read-out voltage VR1 of FIG. 40C, the second bit of the program data may be determined by using second read-out voltages VR21 and VR22 of FIG. 40C, and a third bit may be determined by using third read-out voltages VR31, VR32, VR33, and VR34.

Due to the first read-out voltage VR1 having a voltage level between the third program state and the fourth program state of FIG. 40C, the flash memory MEM determines the first bit of the program data programmed in a memory cell belonging to the erase state E, the first program state P1, and the second program state P2 after completion of a program operation to be "1", and the first bit of the program data programmed in a memory cell belonging to the fourth program state P4 through the seventh program state P7 to be "0". The flash memory MEM determines a bit value of a second bit due to the second read-out voltages VR21 and VR22 having a voltage level between the first program state P1 and the second program state P2 and between the fifth program state P5 and the sixth program state P6.

The third read-out voltages VR31, VR32, VR33, and VR34 of FIG. 40C may be set to have a voltage level between the erase state E and the first program state P1, a voltage level between the second program state P2 and the third program state P3, a voltage level between the fourth program state P4 and the fifth program state P5, and a voltage level between the sixth program state P6 and the seventh program state P7, respectively. The flash memory MEM senses the third bit of the program data having a threshold value lower than the third read-out voltage VR31 as "1", the third bit of the program data having a threshold value between the third read-out voltages VR31 and VR32 as "0", and the third bit of the program data having a threshold value between the third read-out voltages VR32 and VR33 as "1". Also, the flash memory MEM senses the third bit of the program data having a threshold voltage between the third read-out voltages VR33 and VR34 as "0" and the third bit of the program data having a threshold voltage higher than the third read-out voltage VR34 as "1".

For convenience, the following explanation will not be made by distinguishing a case during a program operation from a case after completion of a program operation. However, as described above, a difference between a case during a program operation and a case after completion of a program operation is dependent on a difference of a voltage level of a read-out voltage, and the following embodiments may apply to any of the case during a program operation and the case after completion of a program operation.

The flash memory system MSYS of FIG. 41 may be configured in the same manner as that of FIG. 32. However, the command controller CCON of FIG. 41 further transmits a third read-out command RCMD3 to the flash memory MEM, and the flash memory MEM of FIG. 41 operates according to the third read-out command RCMD3. In FIG. 41, if the flash memory system MSYS is a 3-bit MLC flash memory system, the flash memory system MSYS may generate first soft data of an LSB page (a first bit page) by using a first soft read-out voltage that is obtained by changing a voltage level of a second read-out voltage. In order to generate first soft data of a CSB page (a second bit page), the flash memory system MSYS may read out a second bit page by using the second soft read-out voltages VR21' and VR22' that are obtained by changing voltage levels of the second read-out voltages VR21 and VR22 for determining a distribution of the second bit page as described with reference to FIG. 38B. Also, in order to program an MSB page (a third page), the flash memory system MSYS may generate the first soft data SDTA1 of a third bit page by reading out the third bit page by using third soft read-out voltages VR31', VR32', VR33', and VR34'.

Figure 42:
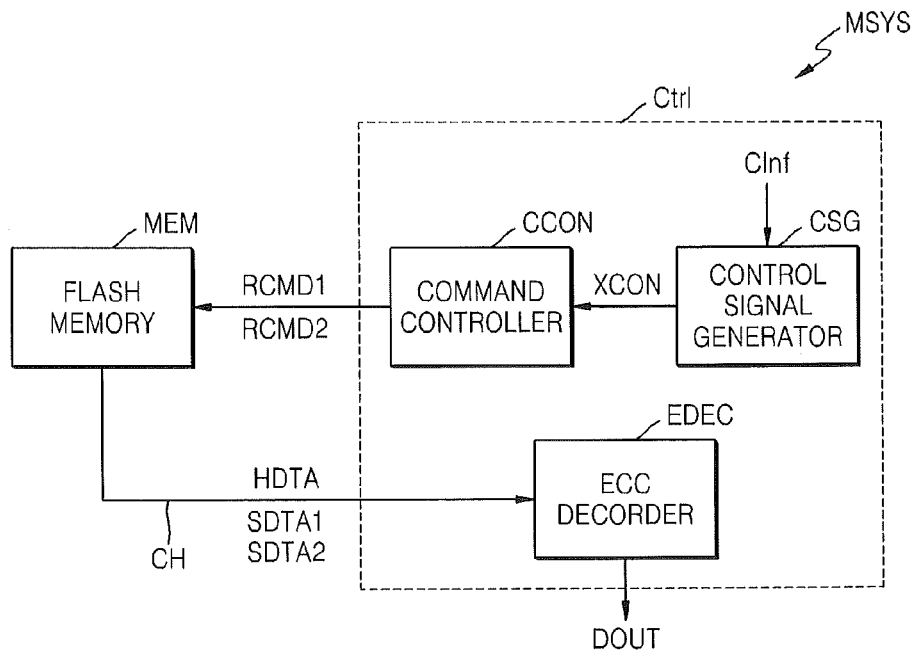
FIG. 42 is a block diagram illustrating the flash memory system according to another embodiment of the inventive concept.
Figure 43:
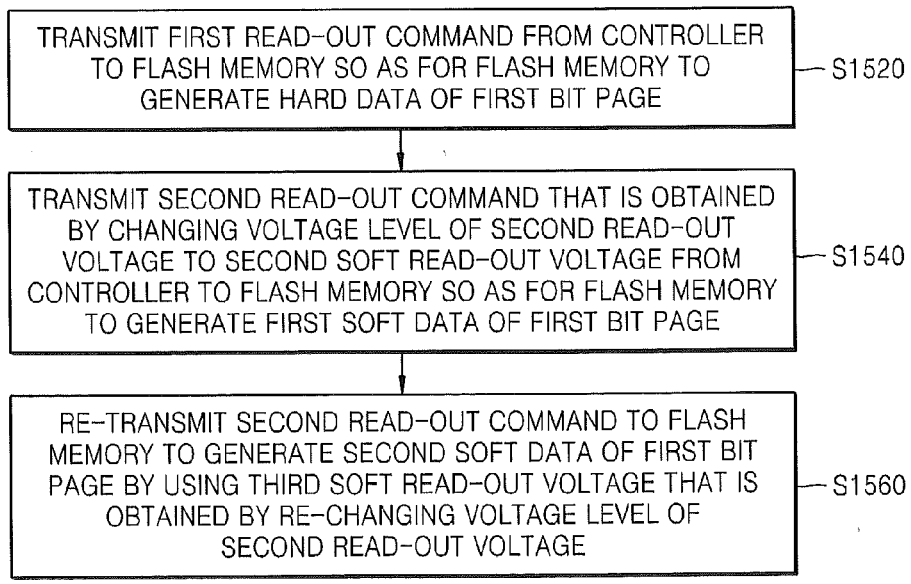
FIG. 43 is a flowchart illustrating a read-out method of the flash memory system of FIG. 42.
Figure 44:
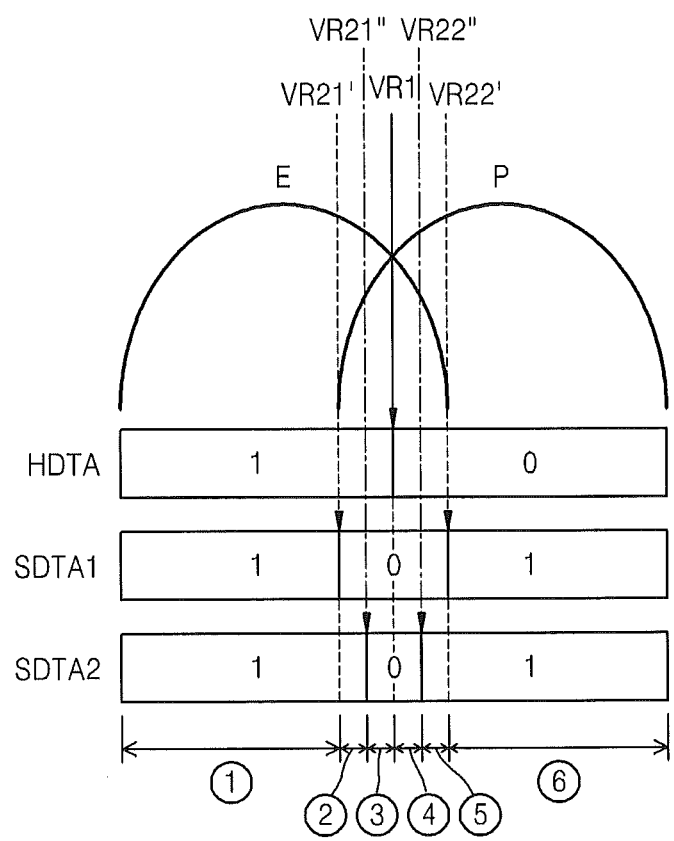
FIGS. 44 and 45 are diagrams for explaining read-out performed by using the read-out method of FIG. 43.

Although one soft data is generated for one bit page, the present embodiment is not limited thereto. The flash memory system MSYS may improve the reliability of read-out by generating two or more pieces of soft data for one bit page. FIG. 42 is a block diagram illustrating the flash memory system MSYS according to another embodiment of the inventive concept. FIG. 43 is a flowchart illustrating a read-out method of the flash memory system MSYS of FIG. 42. FIG. 44 is a diagram for explaining read-out performed by using the read-out method of FIG. 43.

Referring to FIGS. 42 through 44, like the read-out method of FIG. 33, the read-out method includes operation S1520 in which the first read-out command RCMD1 is transmitted from the memory controller Ctrl to the flash memory MEM so as for the flash memory MEM to generate the hard data HDTA of the first bit page, and operation S1540 in which the second read-out command RCMD2 that is obtained by a voltage level of the second read-out voltage to that of a second soft read-out voltage is transmitted from the memory controller Ctrl to the flash memory MEM so as for the flash memory MEM to generate the first soft data SDTA1 of the first bit page.

Furthermore, the read-out method of FIG. 43 of the flash memory system MSYS of FIG. 42 further includes operation S1560 in which the second read-out command RCMD2 is re-transmitted to the flash memory MEM so as to generate second soft data SDTA2 of the first bit page by using the third soft read-out voltages VR21" and VR22" that are obtained by re-changing voltage levels of the second read-out voltages VR21 and VR22. That is, the hard data HDTA is generated by using the first read-out command RCMD1 for the first bit page, and the first soft data SDTA1 and the second soft data SDTA2 are generated by using the second read-out command RCMD2 two times.

The flash memory MEM senses each memory cell of the first bit page as "1" or "0" by using the soft read-out voltages VR21', VR22', VR21", and VR22" that are obtained by changing voltage levels two times. Accordingly, the second soft data SDTA2 of the first bit page is generated to correspond to "111", "101", "100", "000", "001", and "011" for threshold voltages of sections (1) through (6) of FIG. 44.

Figure 45:
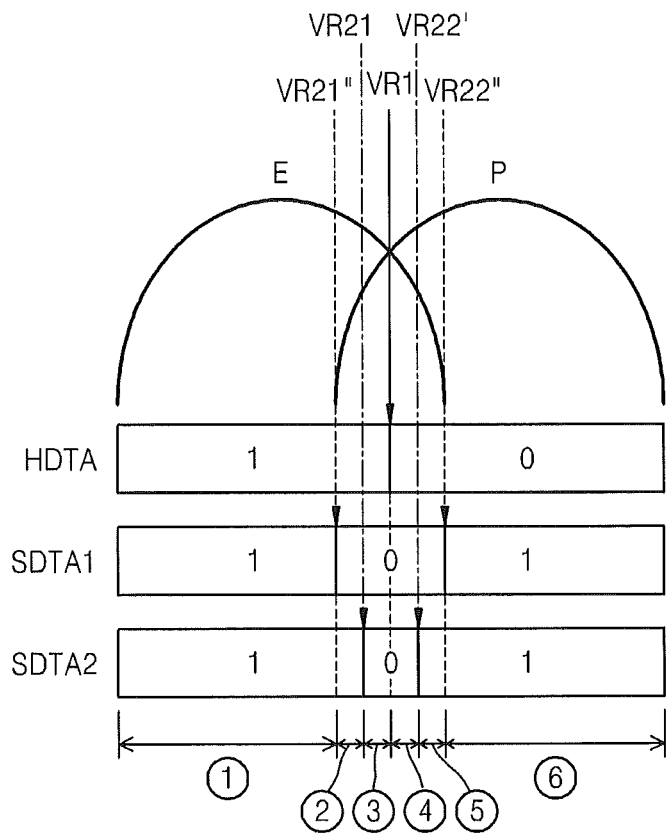

In FIG. 44, the first soft data SDTA1 of the first bit page is generated by using the second soft read-out voltages VR21' and VR22' that are obtained by changing voltage levels, and the second soft data SDTA2 of the first bit page is generated by using the third soft read-out voltages VR21" and VR22" that are obtained by re-changing voltage levels. However, the present embodiment is not limited thereto. As shown in FIG. 45, the second soft data SDTA2 of the first bit page may be generated by using the second soft read-out voltages VR21' and VR22' that are obtained by changing voltage levels, and the first soft data SDTA1 of the first bit page may be generated by using the third soft read-out voltages VR21" and VR22" that are obtained by re-changing voltage levels.

Figure 46:
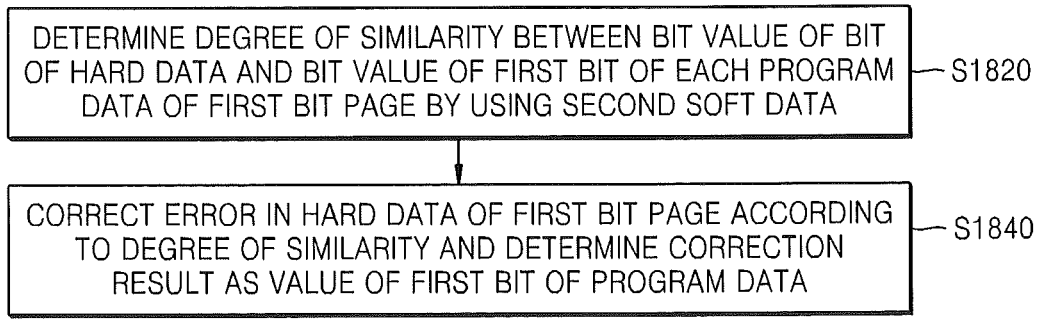
FIG. 46 is a flowchart illustrating a method of determining read-out data of a first bit page based on hard data and first soft data of FIG. 44.

FIG. 46 is a flowchart illustrating a method of determining read-out data of a first bit page based on hard data and first soft data of FIG. 44. Referring to FIGS. 42 and 46, in operation S1820, the error correction decoder EDEC determines the degree of similarity between a bit value of a bit of hard data and a bit value of a first bit of each program data of a first bit page by using the second soft data SDTA2. In operation S1840, the error correction decoder EDEC corrects an error of the hard data HDTA of the first bit page according to the degree of similarity, and determines a correction result as a value of the first bit of the program data.

First soft data and second soft data of a first bit page are generated by using a second soft read-out voltage that is obtained by changing a voltage level of a second read-out voltage two times. First soft data and second soft data for a second bit page or a third bit page may be generated in the same manner as that described above. For example, after the first soft data sdta1 SDTA1 of an MSB page is generated as shown in FIG. 37, second soft data of the MSB page may be generated by re-changing a voltage level of the second read-out voltage. Accordingly, a detailed explanation thereof will not be given.

A plurality of pieces of soft data of a corresponding page may be generated by changing a voltage level of a read-out voltage several times. For example, after the second soft data SDTA2 of the first bit page is generated as shown in FIG. 46, third soft data may be generated by re-changing a voltage level of the second read-out voltage.

Furthermore, the hard data HDTA, the first soft data SDTA1, and the second soft data SDTA2 may be generated by using different read-out commands, which will be explained below.

Figure 47:
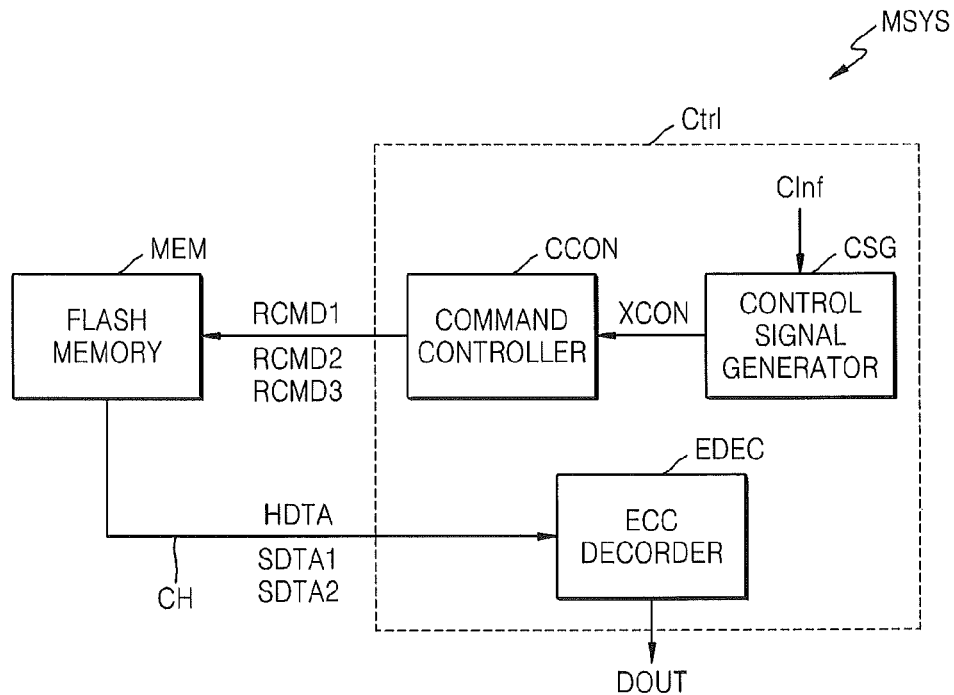
FIG. 47 is a block diagram illustrating the flash memory system according to another embodiment of the inventive concept.
Figure 48:
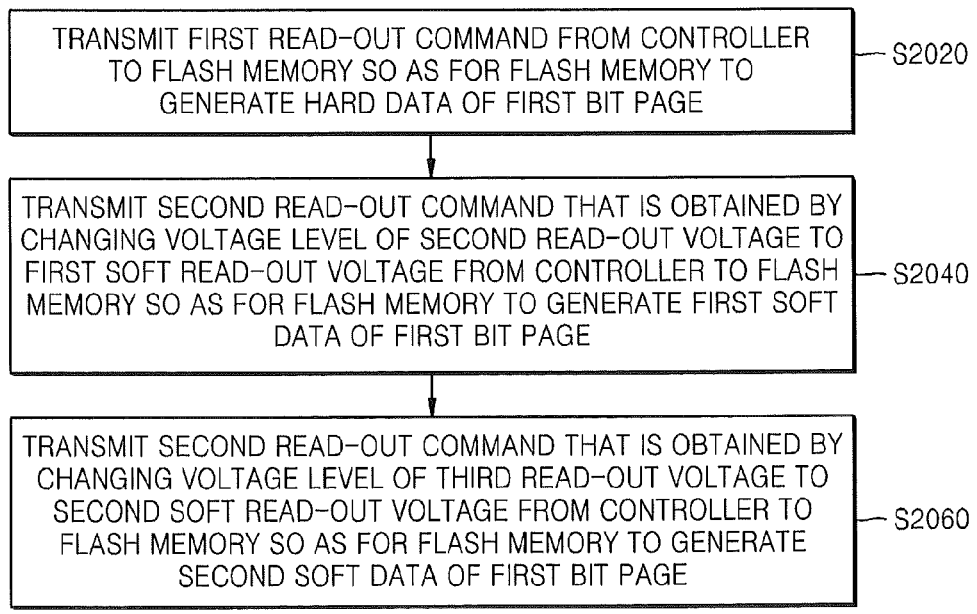
FIG. 48 is a flowchart illustrating a read-out method of the flash memory system of FIG. 47.
Figure 49:
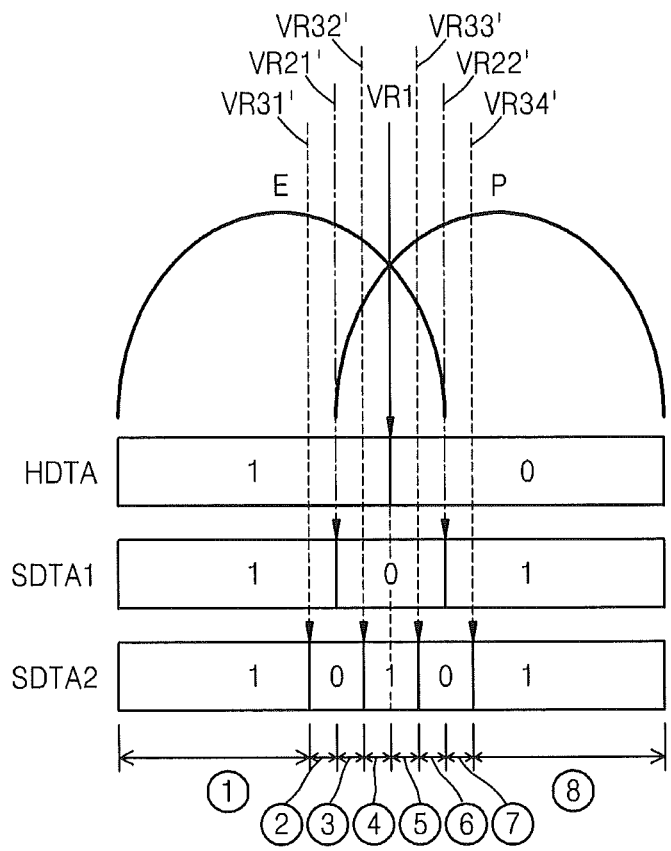
FIG. 49 is a diagram for explaining read-out performed by using the read-out method of FIG. 48.

FIG. 47 is a block diagram illustrating the flash memory system MSYS according to another embodiment of the inventive concept. FIG. 48 is a flowchart illustrating a read-out method of the flash memory system MSYS of FIG. 47. FIG. 49 is a diagram for explaining read-out performed in the read-out method of FIG. 48.

Referring to FIGS. 47 through 49, like the read-out method of FIG. 43, the read-out method includes operation S2020 in which the first read-out command RCMD1 is transmitted from the memory controller Ctrl to the flash memory MEM so as for the flash memory MEM to generate the hard data HDTA of the first bit page, and operation S2040 in which the second read-out command RCMD2 that is obtained by changing a voltage level of the second read-out voltage to those of the first soft read-out voltages VR21' and VR22' is transmitted from the memory controller Ctrl to the flash memory MEM so as for the flash memory MEM to generate the first soft data SDTA1 of the first bit page.

Furthermore, the read-out method of FIG. 48 of the flash memory system MSYS of FIG. 47 further includes operation S2060 in which the third read-out command RCMD3 is re-transmitted to the flash memory MEM so as to generate the second soft data SDTA2 of the first bit page by using the second soft read-out voltages VR31', VR32', VR33', and VR34' that are obtained by changing voltage levels of the third read-out voltages VR31, VR32, VR33, and VR34 as shown in FIG. 40C. That is, the hard data HDTA is generated by using the first read-out command RCMD1, the first soft data SDTA1 is generated by using the second read-out command RCMD2, and the second soft data SDTA2 is generated by using the third read-out command RCMD3, for the first bit page.

The flash memory MEM generates the first soft data SDTA1 by sensing each memory cell of the first bit page by using the first soft read-out voltages VR21' and VR22' as "1" or "0" as shown in FIG. 49. The flash memory MEM generates the second soft data SDTA2 by sensing each memory cell of the first bit page by using the second soft read-out voltages VR31', VR32, VR33', and VR34' as "1" or "0" as shown in FIG. 49. The hard data HDTA, the first soft data SDTA1, and the second soft data SDTA2 of the first bit page are generated to correspond to "111", "110", "100", "101", "001", "000", "010", and "011" for threshold voltages of sections (1) through (8) of FIG. 49.

A method of determining read-out data based on the degree of similarity between the hard data HDTA and the second soft data SDTA2 of FIG. 49 is the same as the method of FIG. 46, and thus a detailed explanation thereof will not be given. Soft data of other pages of the flash memory MEM of FIG. 47 may be generated in various manners.

Referring to FIG. 32 or 42, the control signal XCON for controlling the first soft data SDTA1 or the second soft data SDTA2 to be generated in the flash memory system MSYS is generated by the control signal generator CSG based on the channel information CInf about a state of the channel CH. For example, the control signal generator CSG may determine whether to improve the reliability of read-out by generating only the first soft data SDTA1 or generating both the first soft data SDTA1 and the second soft data SDTA2 based on the channel information CInf and reflect a determination result on the control signal XCON. Alternatively, the control signal generator CSG may determine whether to perform read-out by using any of the read-out methods of FIGS. 38 and 39 based on the channel information CInf and reflect a determination result on the control signal XCON.

Figure 50:
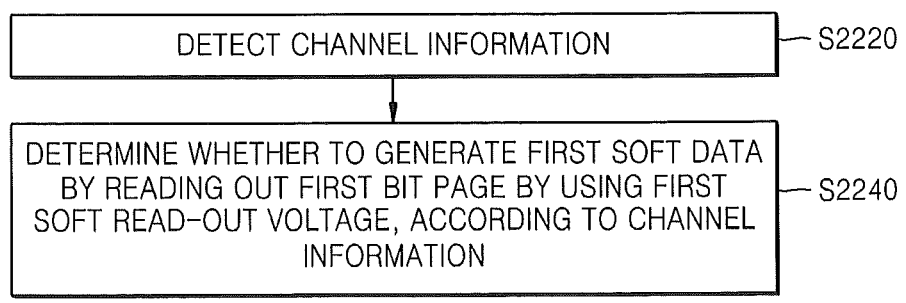
FIG. 50 is a flowchart illustrating a method of generating a control signal of the flash memory system of FIG. 32.

The channel information CInf may be information about an operation temperature of the flash memory MEM, noise, error, the number of times a program operation is performed on a memory cell, and a program data storage time. A read-out method of the flash memory system MSYS may include, in order to generate the control signal XCON based on the channel information CInf, operation S2220 in which the channel information CInf is detected and operation S2240 in which whether to generate first soft data by reading out a first bit page by using a first soft read-out voltage is determined as shown in FIG. 50.

Figure 51:
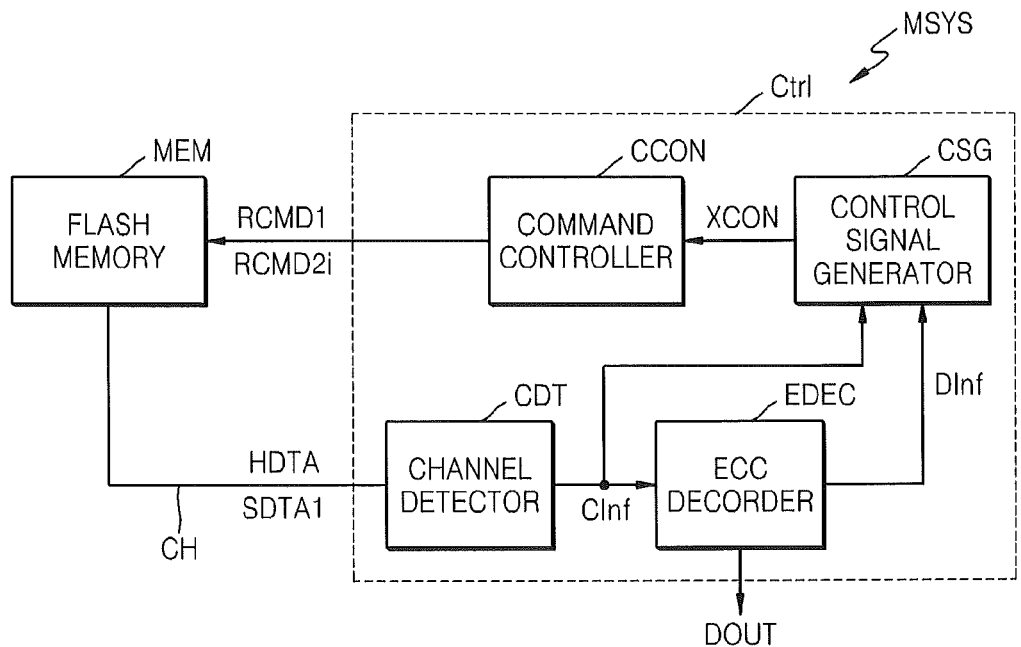
FIGS. 51 through 54 are block diagrams illustrating the flash memory system according to other embodiments of the inventive concept.

The flash memory system MSYS may further include a channel detector CDEC as shown in FIG. 51 in order to detect the channel information CInf as shown in operation S2220 of FIG. 32. The channel detector CDEC connected to the channel CH may detect the channel information CInf, and transmit the channel information CInf to the error correction decoder EDEC and the control signal generator CSG.

The error correction decoder EDEC may perform error correction by using a factor corresponding to the channel information CInf transmitted from the channel detector CDEC. In this case, the error correction decoder EDEC may transmit decoding information DInf about a decoding result obtained by reflecting the channel information CInf to the control signal generator CSG. The control signal generator CSG may generate the control signal XCON by reflecting the channel information CInf or the decoding information DInf.

Figure 52:
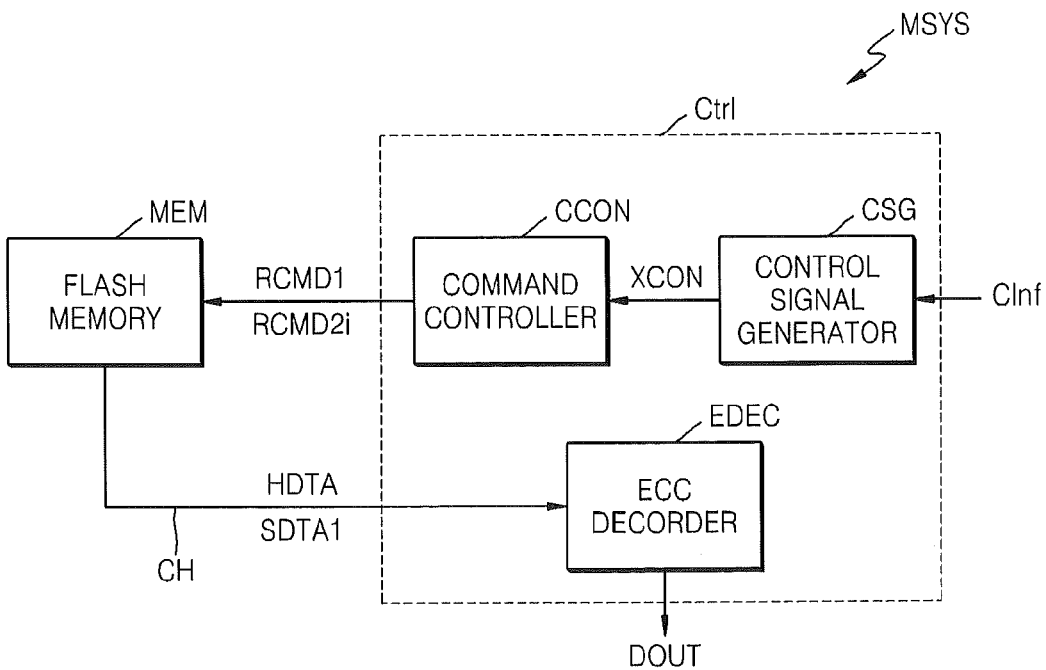

However, the present embodiment is not limited thereto. The channel information CInf may be detected outside the flash memory system MSYS and may be transmitted to the control signal generator CSG as shown in FIG. 52. Although not shown in FIG. 52, the channel information CInf transmitted from the outside to the control signal generator CSG may be transmitted to the error correction decoder EDEC. In this case, as described above, the error correction detector EDEC may transmit the decoding information DInf about the decoding result obtained by reflecting the channel information CInf to the control signal generator CSG, and the control signal generator CSG may generate the control signal XCON by reflecting the channel information CInf or the decoding information DInf.

Figure 53:
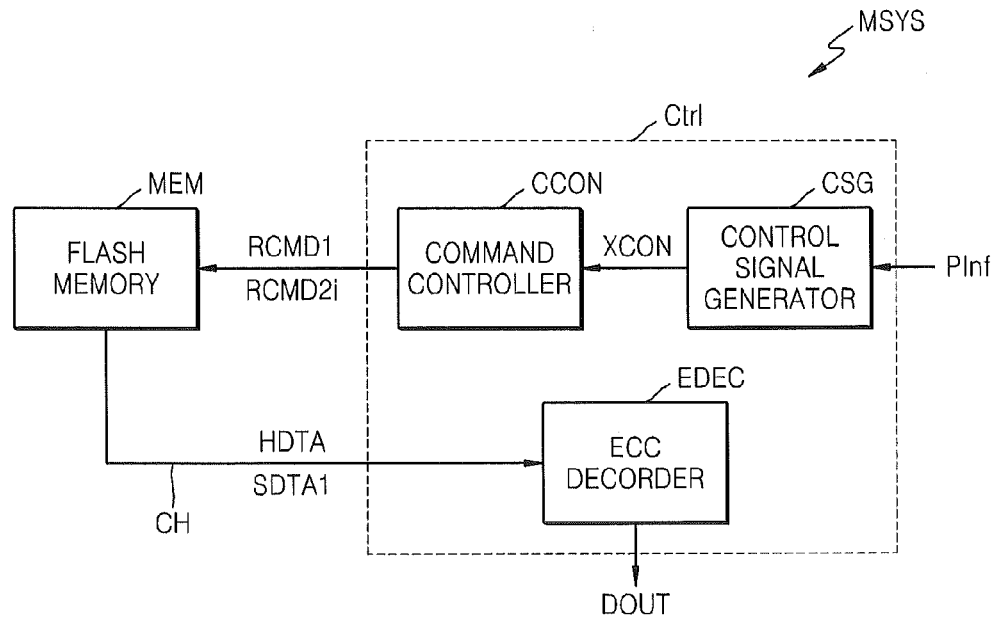

Although the flash memory system MSYS generates the control signal XCON based on the channel information CInf, the present embodiment is not limited thereto. The flash memory system MSYS of FIG. 53 may generate the control signal XCON in response to performance information PInf of the flash memory system MSYS. The performance information PInf of the flash memory system MSYS may be information about the degree of integration or performance degradation of the flash memory MEM. The performance information PInf may be transmitted from the outside as shown in FIG. 53. Alternatively, although not shown in FIG. 53, the performance information PInf may be stored in a register (not shown) of the memory controller Ctrl or the control signal generator CSG.

Figure 54:
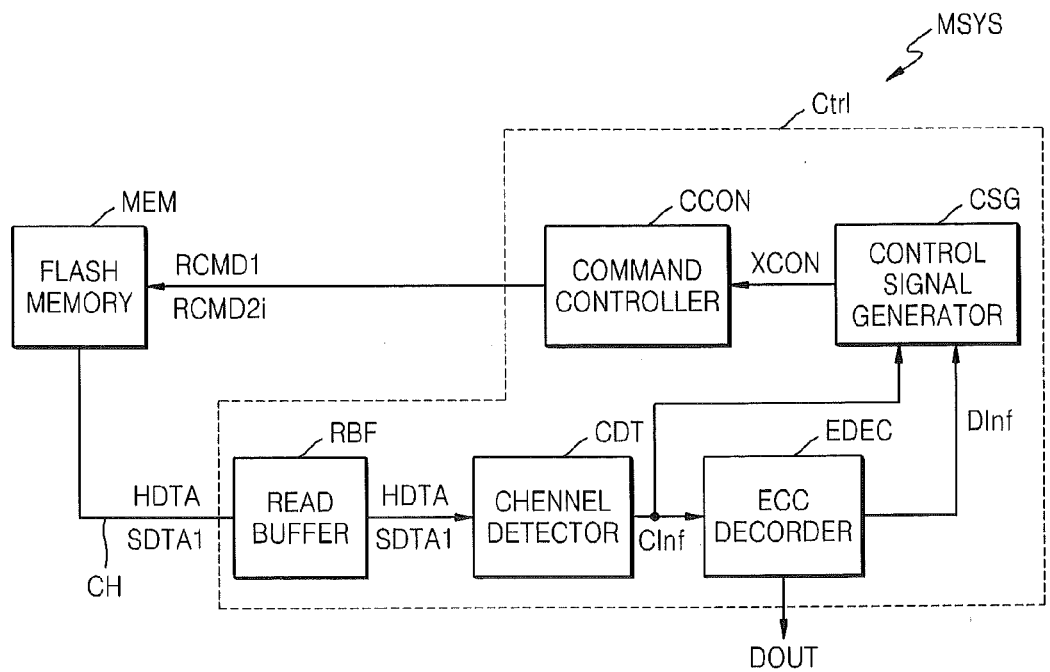

FIG. 54 is a block diagram illustrating the flash memory system MSYS according to another embodiment of the inventive concept. Referring to FIG. 54, the flash memory system MSYS further includes a read buffer RBUF for buffering the hard data HDTA and the first soft data SDTA1 transmitted from the flash memory MEM. The read buffer RBUF may transmit the hard data HDTA and the first soft data SDTA1 to the channel detector CDEC when a predetermined period of time after the hard data HDTA and the first soft data SDTA1 are received from the flash memory MEM elapses. However, in the flash memory system MSYS not including the channel detector CDEC as shown in FIG. 54, the hard data HDTA and the first soft data SDTA1 may be transmitted to the error correction decoder EDEC.

While the inventive concept has been particularly shown and described with reference to exemplary embodiments thereof using specific terms, the embodiments and terms have been used to explain the inventive concept and should not be construed as limiting the scope of the inventive concept defined by the claims. For example, in a flash memory system, a method of generating first soft data or second soft data of a first bit page and a method of generating first soft data or second soft data of a second bit page may be different from each other. Also, a method of generating first soft data or second soft data of each bit page may be applied to a flash memory system including a memory cell that is programmed to store 4 or more-bit program data.

According to a flash memory and a reading method of the flash memory of the inventive concept, even when the flash memory does not support soft decision coding, error correction performance may be improved.

While the inventive concept has been particularly shown and described with reference to exemplary embodiments thereof, it will be understood that various changes in form and details may be made therein without departing from the spirit and scope of the following claims.

What is claimed is:

1. A reading method oaf MLC (Multi-Level Cell) flash memory, the reading method comprising:
    receiving a first read-out command from a controller located out of the flash memory;
    generating hard data of a first page by using a first hard read voltage in response to the first read-out command;
    receiving a second read-out command from the controller; and
    generating soft data of the first page by using first soft read voltages in response to the second read-out command;
    wherein each of voltage levels of the first soft read voltages are set by modifying a voltage level of at least one second hard read voltage used for generating hard data of a second page;
    wherein the first page is a page in which each of memory cells is programmed to store a high-order bit of multi-bits, and the first hard read voltage is set to have two or more different voltage levels whose number corresponds to the number of the multi-bits; and
    wherein the generating of the soft data of the first page comprises:
        transmitting to a first latch a first soft value that is obtained by sensing the first page by using one of the first soft read voltages corresponding to a first voltage level of the first hard read voltage, and transmitting to a second latch a third soft value, wherein the third soft value is obtained by cooking the first soft value of the first latch and a second soft value, wherein the second soft value is obtained by sensing the first page by using the other one of the first soft read voltages;
        transmitting to the first latch a first soft value that is obtained by sensing the first page by using one of second soft read voltages corresponding to a second voltage level of the first hard read voltage, and obtaining a third soft value of the second soft read voltages by cooking the first soft value of the first latch and a second soft value that is obtained by sensing the first page by using the other one of the second soft read voltages; and
        changing the third soft value of the second latch by cooking the third soft value of the second soft read voltages and the third soft value previously stored in the second latch.

2. The reading method of claim 1, further comprising:
    receiving a request from the controller; and
    modifying the voltage level of at least one second hard read voltage to the voltage levels of the first soft read voltages in response to the request.

3. The reading method of claim 1, wherein the first soft read voltages are set by changing each voltage level of at least two second hard read voltages for the second page, respectively.

4. The reading method of claim 1, wherein the first soft read voltages are set by changing a voltage level of one second hard read voltage for the second target page.

5. The reading method of claim 1, wherein the voltage levels of the first soft read voltages are set when an array of the flash memory is in a ready state.

6. The reading method of claim 1, further comprising:
    changing the third soft value of the second latch by sequentially obtaining the soft value for all voltage levels of the first hard read voltage; and
    outputting the third soft value of the second latch as the soft data.

7. The reading method of claim 1, further comprising: outputting the hard data of the first page from the flash memory, while the soft data of the first page is generated.

8. The reading method of claim 1, further comprising backing up the hard data of the first page stored in one of a plurality of latches of a buffer unit of the flash memory to another latch of the buffer unit while the soft data of the first page is generated.

9. The reading method of claim 8, further comprising continuously outputting the hard data that is backed up and the soft data that is generated.

10. The reading method of claim 8, when the flash memory comprises a plurality of memory cell arrays, the first page is included in each of the plurality of memory cell arrays, wherein the generating the hard data and the generating the soft data are performed for each first page.

11. The reading method of claim 10, further comprising sequentially and continuously outputting, for a sequence of the memory cell arrays, the hard data that is backed up of the first page of each of the plurality of memory cell arrays and the soft data of the first page of each of the plurality of memory cell arrays.

12. A reading method of a MLC (Multi-Level Cell) flash memory, the reading method comprising:
    receiving a first read-out command from a controller located outside of the flash memory;
    generating hard data of a first page by using a first hard read voltage in response to the first read-out command;
    receiving a second read-out command from the controller; and
    generating soft data of the first page by using first soft read voltages in response to the second read-out command,
    wherein each of the voltage levels of the first soft read voltages are set by modifying a voltage level of at least one second hard read voltage used for generating hard data of a second page,
    wherein the at least one second hard read voltage is transmitted with the second read-out command, and
    wherein the first programmed to store one bit of multi-bits and the second is programmed to store another bit of the multi-bits.

13. The reading method of claim 12, further comprising:
    receiving a request from the controller; and
    modifying the voltage level of the at least one second hard read voltage to the voltage levels of the first soft read voltages in response to the request.

14. The reading method of claim 12, wherein the first page is a page in which each of memory cells is programmed to store a low-order bit of multi-bits and the second page is a page in which each of memory cells is programmed to store a high-order bit of multi-bits.

15. The reading method of claim 12, wherein the first soft read voltages are set by changing each voltage level of at least two second hard read voltages for the second page, respectively.

16. The reading method of claim 12, wherein the first soft read voltages are set by changing a voltage level of one second hard read voltage for the second target page.

17. The reading method of claim 12, wherein the voltage levels of the first soft read voltages are set when an array of the flash memory is in a ready state.

* * * * *